(12) United States Patent
Yoshida et al.

(10) Patent No.: US 11,915,975 B2
(45) Date of Patent: Feb. 27, 2024

(54) METHOD OF MANUFACTURING SEMICONDUCTOR DEVICE

(71) Applicant: RENESAS ELECTRONICS CORPORATION, Tokyo (JP)

(72) Inventors: Tetsuya Yoshida, Tokyo (JP); Tomohiro Tomizawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 111 days.

(21) Appl. No.: 17/480,746

(22) Filed: Sep. 21, 2021

(65) Prior Publication Data
US 2022/0115270 A1    Apr. 14, 2022

(30) Foreign Application Priority Data

Oct. 14, 2020   (JP) ................................. 2020-172966

(51) Int. Cl.
| | | |
|---|---|---|
| *H01L 21/768* | (2006.01) | |
| *H01L 21/66* | (2006.01) | |
| *H01L 27/12* | (2006.01) | |
| *H01L 29/66* | (2006.01) | |

(52) U.S. Cl.
CPC .. *H01L 21/76897* (2013.01); *H01L 21/76805* (2013.01); *H01L 22/32* (2013.01); *H01L 27/1203* (2013.01); *H01L 29/66568* (2013.01)

(58) Field of Classification Search
CPC ......... H01L 21/76897; H01L 21/76805; H01L 22/32; H01L 27/1203; H01L 29/66568; H01L 22/14; H01L 22/30; H01L 22/34; H01L 29/6653; H01L 29/66628; H01L 29/66772; H01L 29/7834; H01L 29/78654; H01L 29/6656; H10B 10/12; H10B 10/18
See application file for complete search history.

(56) References Cited

U.S. PATENT DOCUMENTS

| | | | |
|---|---|---|---|
| 5,889,306 A | 3/1999 | Christensen et al. | |
| 6,344,750 B1* | 2/2002 | Lo ........................ | G01R 31/307 |
| | | | 850/10 |
| 9,299,720 B2 | 3/2016 | Yamamoto et al. | |
| 9,773,774 B1* | 9/2017 | Lam ........................ | H01L 22/34 |

(Continued)

FOREIGN PATENT DOCUMENTS

| | | |
|---|---|---|
| JP | H10-209468 A | 8/1998 |
| JP | 2015-122367 A | 7/2015 |

OTHER PUBLICATIONS

Notice of Reasons for Refusal issued in JP Patent Application No. 2020-172966, dated Dec. 19, 2023 w/English MT.

*Primary Examiner* — Shahed Ahmed
*Assistant Examiner* — Vicki B. Booker
(74) *Attorney, Agent, or Firm* — Rimon P.C.; Tomoki Tanida

(57) ABSTRACT

A first MISFET is formed on a semiconductor layer of an SOI substrate in a circuit region and a second MISFET composing a TEG for VC inspection is formed on the semiconductor layer of the SOI substrate in a TEG region. An interlayer insulating film is formed, contact holes are formed in the interlayer insulating film, and plugs are formed in the contact holes, respectively. In the TEG region, the plugs include a plug electrically connected to both the semiconductor substrate composing the SOI substrate and the semiconductor layer composing the SOI substrate.

12 Claims, 27 Drawing Sheets

(56) References Cited

U.S. PATENT DOCUMENTS

2015/0270181 A1\* 9/2015 De .................. H01J 37/147
                                                    438/14
2017/0133287 A1   5/2017 Moll et al.

\* cited by examiner

METHOD OF MANUFACTURING SEMICONDUCTOR DEVICE

CROSS-REFERENCE TO RELATED APPLICATIONS

The disclosure of Japanese Patent Application No. 2020-172966 filed on Oct. 14, 2020 including the specification, drawings and abstract is incorporated herein by reference in its entirety.

BACKGROUND

The present invention relates to a method of manufacturing a semiconductor device, and relates to, for example, a technology effectively applied when manufacturing a semiconductor device having a contact plug.

In order to obtain high reliability in semiconductor devices, elimination of formation failure of wirings, vias, contact plugs, etc. has become an issue to be solved. Examples of probable process-induced formation failures include the defect related to the contact plug. More specifically, there is the defect due to high resistance caused by the defective filling or the transformation at the bottom of the contact plug.

When inspecting the formation failure of the contact plug, for example, a method in which a TEG (Test Elemental Group) formed for inspection and having a configuration in which a contact plug is connected to a semiconductor substrate is irradiated with an electron beam, thereby inspecting the continuity between the contact plug and the semiconductor substrate has been known. This method is called the VC (Voltage contrast) inspection. Japanese Unexamined Patent Application Publication No. 2015-122365 (Patent Document 1) describes a technology related to the VC inspection.

There are Disclosed Techniques Listed Below

[Patent Document 1] Japanese Unexamined Patent Application Publication No. 2015-122367

SUMMARY

It is desired to improve the reliability in the semiconductor device having the contact plug.

Other problems and novel features will be apparent from the description of this specification and accompanying drawings.

According to an embodiment, a method of manufacturing a semiconductor device includes steps of: (a) providing an SOI substrate having a stacked structure including a semiconductor substrate, an insulating layer on the semiconductor substrate, and a semiconductor layer on the insulating layer; and (b) forming a first MISFET composing a certain circuit on the semiconductor layer in a first region, and forming a second MISFET composing a TEG for VC inspection on the semiconductor layer in a second region. The method of manufacturing the semiconductor device further includes steps of: (c) forming a first interlayer insulating film on a main surface of the SOI substrate; and (d) forming a plurality of first contact holes in the first interlayer insulating film located in the first region, and forming a plurality of second contact holes in the first interlayer insulating film located in the second region. The method of manufacturing the semiconductor device further includes a step of: (e) forming a plurality of first contact plugs composing the circuit in the plurality of first contact holes, respectively, and forming a plurality of second contact plugs composing the TEG in the plurality of second contact holes, respectively. The plurality of second contact plugs includes a third contact plug electrically connected to both the semiconductor layer located in the second region and the semiconductor substrate located in the second region.

According to an embodiment, it is possible to improve the reliability of the semiconductor device.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification, details, or a supplementary explanation thereof. Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference signs throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

First Embodiment

Figure 1:
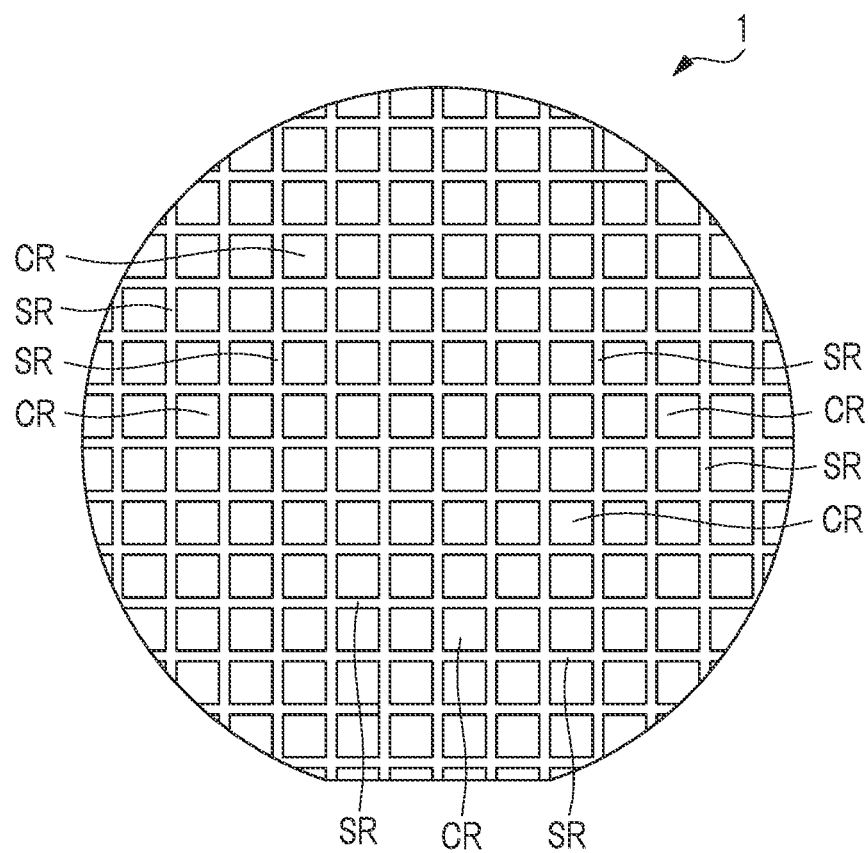
FIG. 1 is a plan view of an SOI substrate used in the process for manufacturing the semiconductor device according to an embodiment (first embodiment).

The process for manufacturing the semiconductor device according to the first embodiment will be described with reference to drawings. FIG. 1 is a plan view of an SOI substrate used in the process for manufacturing the semiconductor device according to the first embodiment. FIG. 2 to FIG. 17 are cross-sectional views each showing a principal part in the process for manufacturing the semiconductor device according to the first embodiment.

Figure 2:
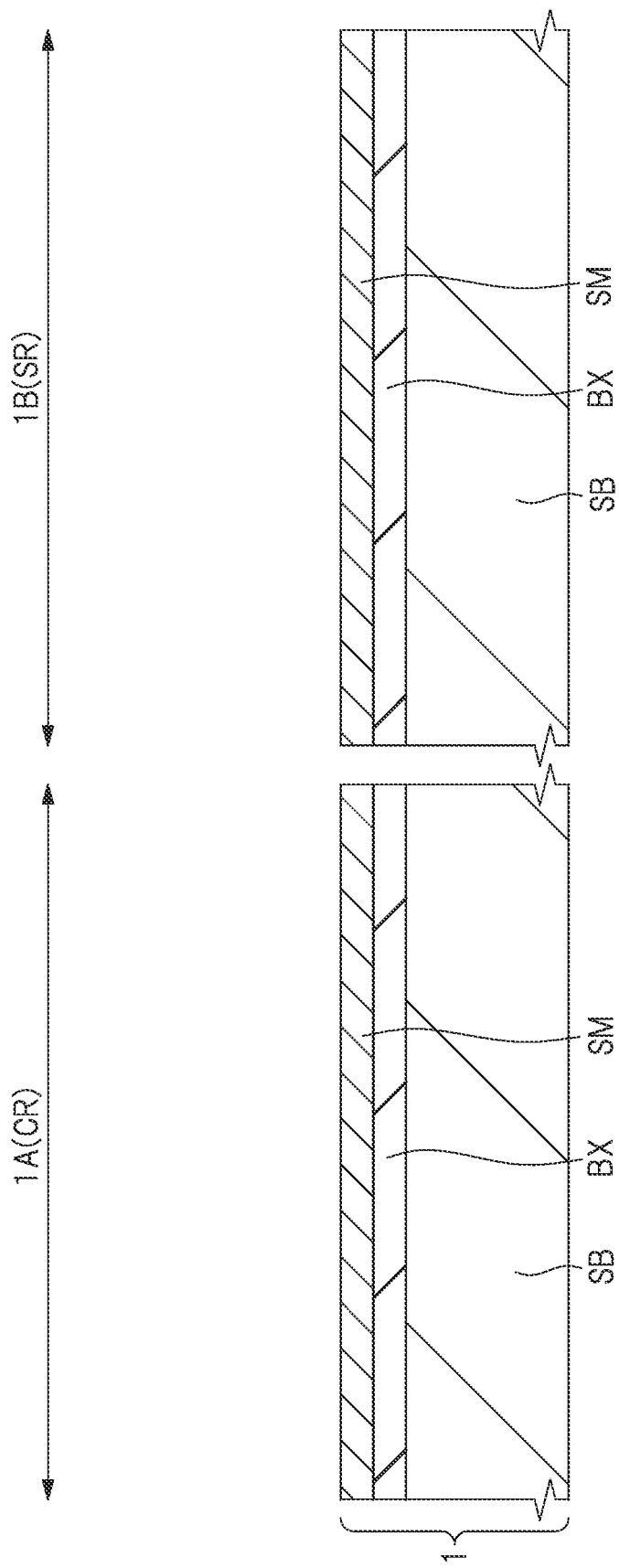
FIG. 2 is a cross-sectional view showing a principal part in the process for manufacturing the semiconductor device according to the embodiment (first embodiment).

First, as shown in FIG. 1 and FIG. 2, an SOI (Silicon On Insulator) substrate 1 is prepared (provided).

As can be seen from FIG. 2, the SOI substrate 1 includes a semiconductor substrate (support substrate) SB as a support substrate, an insulating layer (buried insulating film) BX formed on a main surface of the semiconductor substrate SB, and a semiconductor layer SM formed on an upper surface of the insulating layer BX.

The semiconductor substrate SB is a support substrate that supports the insulating layer BX and a structure above the insulating layer BX, but is also a semiconductor substrate. The semiconductor substrate SB is preferably a single crystal silicon substrate, and is made of, for example, p type single crystal silicon. For example, the semiconductor substrate SB can be formed of single crystal silicon having a specific resistance of about 1 Ωcm to 10 Ωcm. The thickness of the semiconductor substrate SB can be, for example, about 700 μm to 750 μm. The insulating layer BX is preferably a silicon oxide film, and the thickness of the insulating layer BX can be, for example, about 10 nm to 20 nm. When the insulating layer BX is a silicon oxide film, the insulating layer BX can be regarded also as a buried oxide film, that is, a BOX (Buried Oxide) layer. The semiconductor layer SM is made of single crystal silicon or the like. For example, the semiconductor layer SM can be formed of single crystal silicon having a specific resistance of about 1 Ωcm to 10 Ωcm. The thickness of the semiconductor layer SM is thinner than the thickness of the semiconductor substrate SB which is the support substrate, and the thickness of the semiconductor layer SM can be, for example, about 15 nm to 25 nm. The SOI substrate 1 is composed of the semiconductor substrate SB, the insulating layer BX, and the semiconductor layer SM.

The method of manufacturing the SOI substrate 1 is not limited, but the SOI substrate 1 can be manufactured by using, for example, the SIMOX (Silicon Implanted Oxide) method, the bonding method, or the smart cut process.

The SOI substrate 1 at this stage is in the state of a substantially disk-shaped wafer (semiconductor wafer).

Here, as shown in FIG. 1, the SOI substrate 1 includes chip regions (semiconductor chip regions, semiconductor device regions) CR, from which semiconductor chips (semiconductor devices) are to be acquired, and a scribe region (cutting region) SR between the chip regions CR, and each chip region CR is surrounded by the scribe region SR in a plan view. Namely, in the SOI substrate 1, a plurality of chip regions CR is arranged in an array, and the region between the chip regions CR arranged in an array corresponds to the scribe region SR. Therefore, in the SOI substrate 1, the plurality of chip regions CR arranged in an array is partitioned by the scribe region SR. By cutting (dicing) the SOI substrate 1 along the scribe region SR in the dicing process (cutting process), each chip region CR is singulated to become a semiconductor chip (semiconductor device). The chip region CR and the scribe region SR correspond to different planar regions on the main surface of the same SOI substrate 1.

FIG. 2 to FIG. 17 are cross-sectional views each showing a principal part of a circuit region A in which various circuits are formed and a TEG region 1B in which a TEG is formed in the SOI substrate 1.

Semiconductor elements composing various circuits such as SRAM (Static Random Access Memory) are formed in the circuit region 1A, and a TEG for VC inspection or the like is formed in the TEG region 1B. The TEG for VC inspection formed in the TEG region 1B can be, for example, a TEG having an SRAM structure. The circuit region 1A is included in the chip region CR, and when each chip region CR is singulated to manufacture a semiconductor chip, the circuit region 1A is included in the semiconductor chip. A MISFET 2 formed in the circuit region 1A is a MISFET that can be used in a semiconductor chip as a product. Namely, the MISFET 2 formed in the circuit region 1A is a transistor composing a certain circuit (here, SRAM circuit). The TEG region 1B is included in the scribe region SR, and when each chip region CR is singulated to manufacture a semiconductor chip, the TEG region 1B is not included in the semiconductor chip. A MISFET 3 formed in the TEG region 1B is a MISFET (so-called dummy transistor) composing the TEG for VC inspection, and is not a MISFET that can be used in a semiconductor chip as a product.

Figure 3:
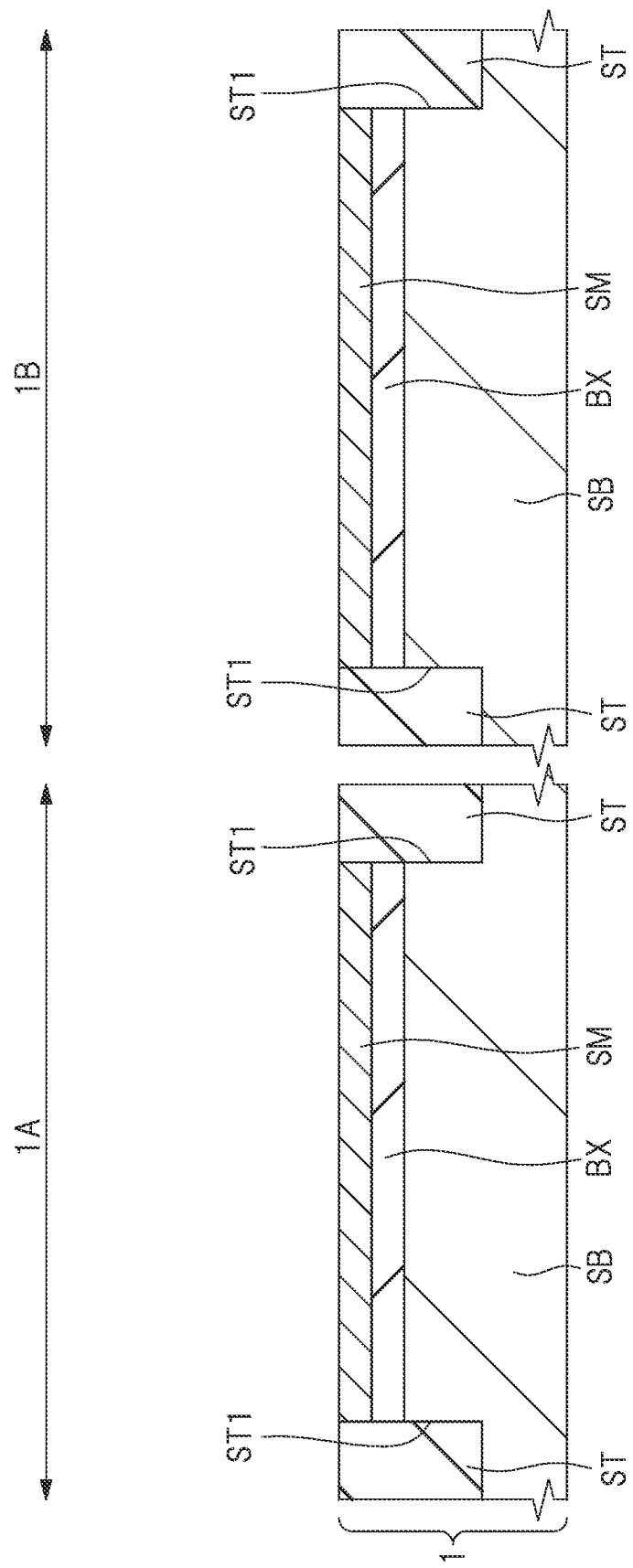
FIG. 3 is a cross-sectional view showing a principal part in the process for manufacturing the semiconductor device subsequent to FIG. 2.

Next, as shown in FIG. 3, an element isolation region ST is formed in the SOI substrate 1.

In order to form the element isolation region ST, for example, an element isolation trench ST1 that penetrates the semiconductor layer SM and the insulating layer BX and reaches the substrate SB at the bottom is formed in the main surface of the SOI substrate 1 (semiconductor layer SM) by the photolithography technique and the dry etching technique. Since the element isolation trench ST1 penetrates the semiconductor layer SM and the insulating layer BX and the bottom of the element isolation trench ST1 reaches the substrate SB (the bottom of the element isolation trench ST1 is located in the middle of the thickness of the substrate SB), the substrate SB is exposed at the bottom of the element isolation trench ST1. Then, the element isolation region ST can be formed by filling the element isolation trench ST1 with an insulating film by using a film forming technique, a CMP technique, and the like. For example, the element isolation region ST made of an insulating film buried in the element isolation trench ST1 can be formed by forming an insulating film on the main surface of the SOI substrate 1 so as to fill the element isolation trench ST1 and then removing the insulating film outside the element isolation trench ST1 by the CMP (Chemical Mechanical Polishing) method or the like. The element isolation region ST is formed in both the circuit region 1A and the TEG region 1B in the SOI substrate 1.

In the SOI substrate 1, the semiconductor layer SM is divided into a plurality of sections (that is, active regions) by forming the element isolation region ST, and the semiconductor layer SM composing each active region is surrounded by the element isolation region ST. Further, the MISFET (Metal Insulator Semiconductor Field Effect Transistor) is formed on the semiconductor layer SM composing each active region by the following process.

Figure 4:
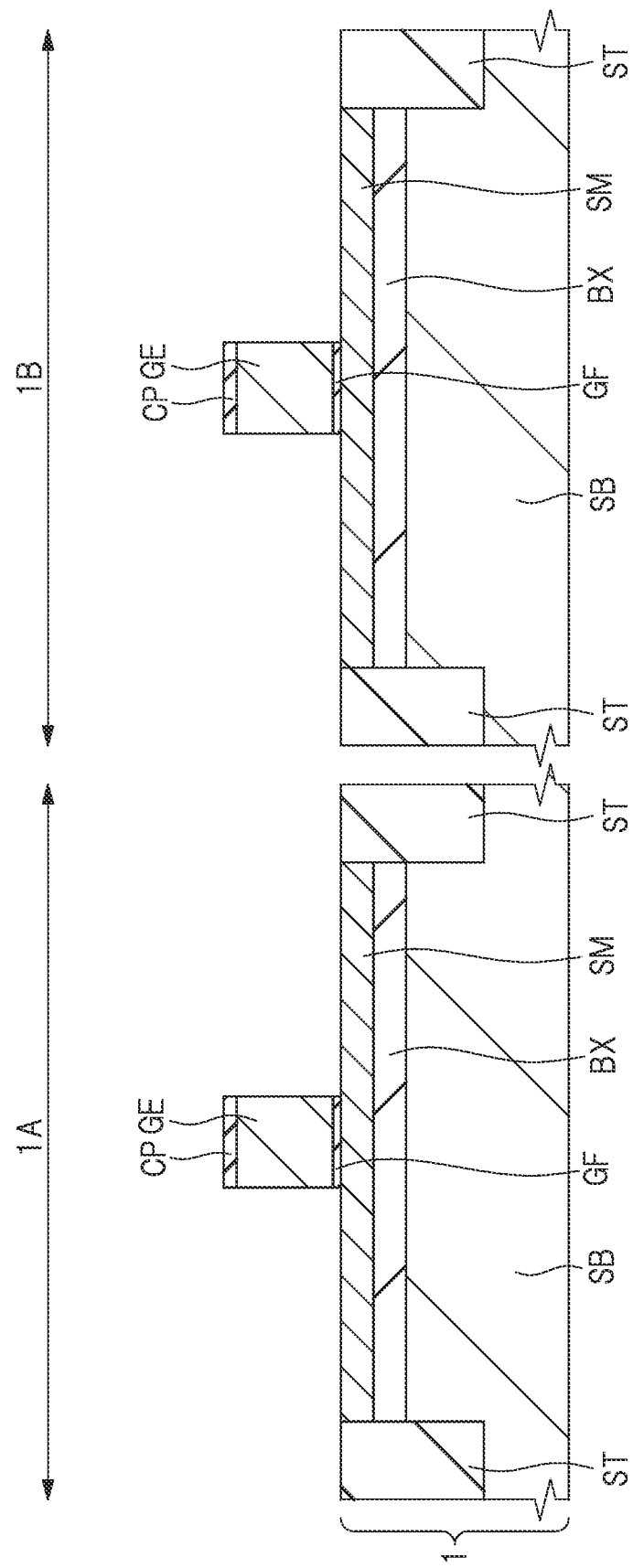
FIG. 4 is a cross-sectional view showing a principal part in the process for manufacturing the semiconductor device subsequent to FIG. 3.

Next, as shown in FIG. 4, a gate electrode GE is formed on the main surface of the SOI substrate 1, that is, the main surface of the semiconductor layer SM via a gate insulating film GF. An insulating film CP having the same planar shape as the gate electrode GE may be formed on the gate electrode GE.

A specific example of the step of forming the gate insulating film GF and the gate electrode GE will be described. First, after an insulating film for the gate insulating film GF is formed on the main surface of the SOI substrate 1, that is, on the main surface of the semiconductor layer SM, a conductive film (for example, polysilicon film) for the gate electrode GE is formed on the insulating film, and an insulating film (insulating film to be the insulating film CP later) is formed on the conductive film. Thereafter, by patterning a stacked film of the conductive film for the gate electrode GE and the insulating film on the conductive film by using the photolithography technique and the etching technique, the gate electrode GE made of the patterned conductive film can be formed. The insulating film for the gate insulating film GF remains between the gate electrode GE and the semiconductor layer SM, and this becomes the gate insulating film GF. Further, on the gate electrode GE, the insulating film CP patterned in substantially the same planar shape as the gate electrode GE is formed. Further, the insulating film for the gate insulating film GF can be removed by the dry etching performed in the patterning step of the conductive film for the gate electrode GE or the wet etching performed after the dry etching, except for the portion covered with the gate electrode GE.

The gate insulating film GF and the gate electrode GE are formed in both the circuit region 1A and the TEG region 1B in the SOI substrate 1. The gate insulating film GF and the gate electrode GE formed in the circuit region 1A correspond to the gate insulating film and the gate electrode of a MISFET 2 composing various circuits, and the gate insulating film GF and the gate electrode GE formed in the TEG region 1B correspond to the gate insulating film and the gate electrode of a MISFET 3 composing the TEG.

Figure 5:
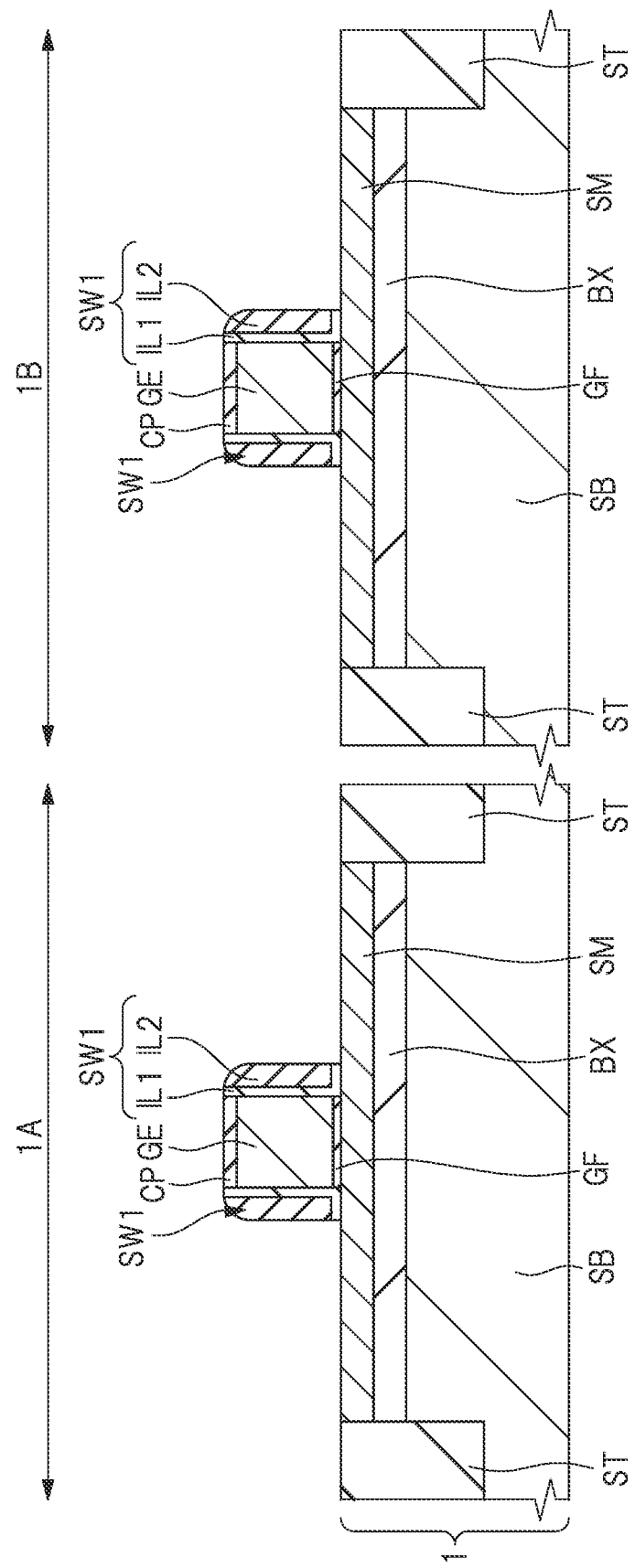
FIG. 5 is a cross-sectional view showing a principal part in the process for manufacturing the semiconductor device subsequent to FIG. 4.

Next, as shown in FIG. 5, a sidewall spacer (sidewall, sidewall insulating film) SW1 is formed as a sidewall insulating film on a sidewall of the gate electrode GE in each of the circuit region 1A and the TEG region 1B. The sidewall spacer SW1 is composed of a stacked film of an insulating film IL1 made of a silicon oxide film or the like and an insulating film IL2 made of a silicon nitride film or the like. The sidewall spacer SW1 can be formed by, for example, forming a stacked film composed of the insulating film IL1 and the insulating film IL2 on the insulating film IL1 on the main surface of the SOI substrate 1 (that is, semiconductor layer SM) so as to cover the gate electrode GE, and then etching back the stacked film by the anisotropic etching technique.

Figure 6:
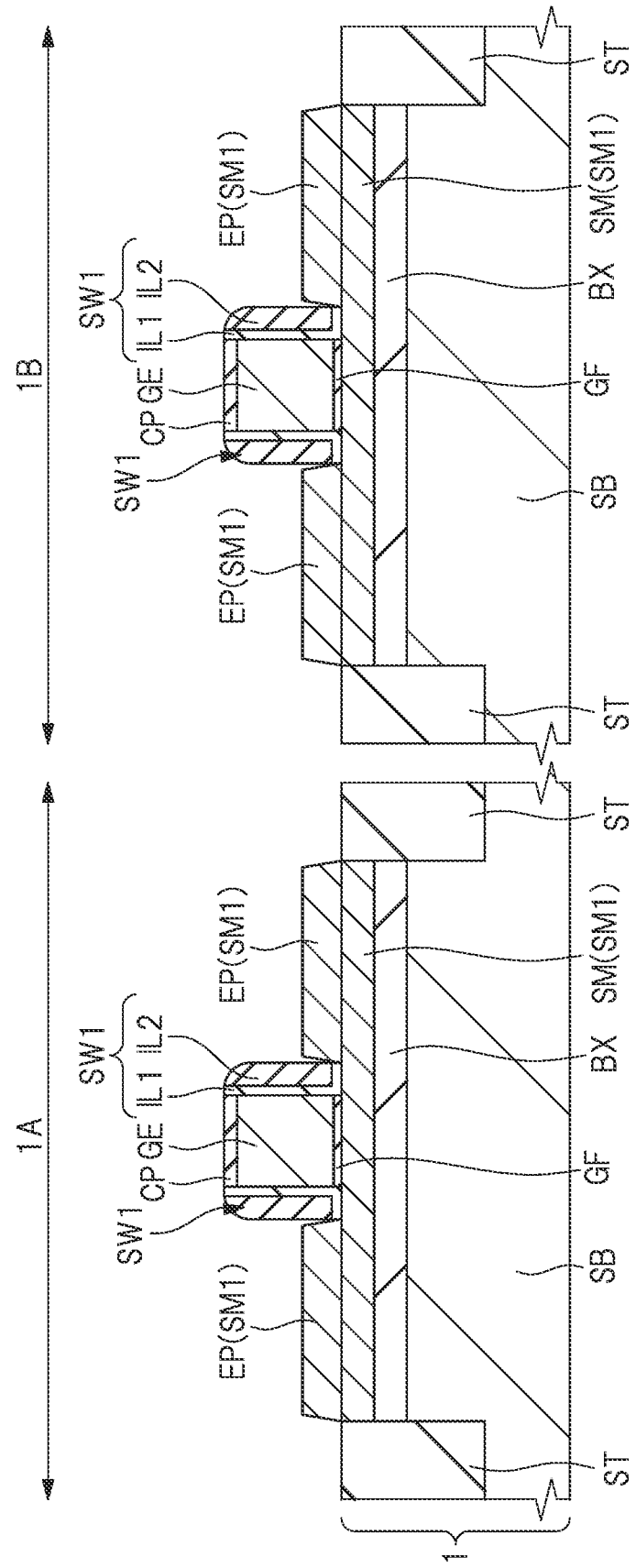
FIG. 6 is a cross-sectional view showing a principal part in the process for manufacturing the semiconductor device subsequent to FIG. 5.

Next, as shown in FIG. 6, in each of the circuit region 1A and the TEG region 1B, a semiconductor layer (epitaxial layer) EP is formed by the epitaxial growth method on the portion of the semiconductor layer SM that is not covered with the gate electrode GE and the sidewall spacer SW1 (that is, on the exposed surface of the semiconductor layer SM). Therefore, the semiconductor layer EP is formed on the regions of the semiconductor layer SM located on both sides of the structure composed of the gate electrode GE and the sidewall spacer SW1. The semiconductor layer EP is made of, for example, silicon (single crystal silicon).

Note that the combination of the semiconductor layer SM and the semiconductor layer EP formed on the semiconductor layer SM is referred to as a semiconductor layer SM1 below. When the step of forming the semiconductor layer EP is omitted as another embodiment, the step of forming the sidewall spacer SW1 can also be omitted. Further, "the semiconductor layer SM1" can be replaced with "the semiconductor layer SM" in the following description.

Figure 7:
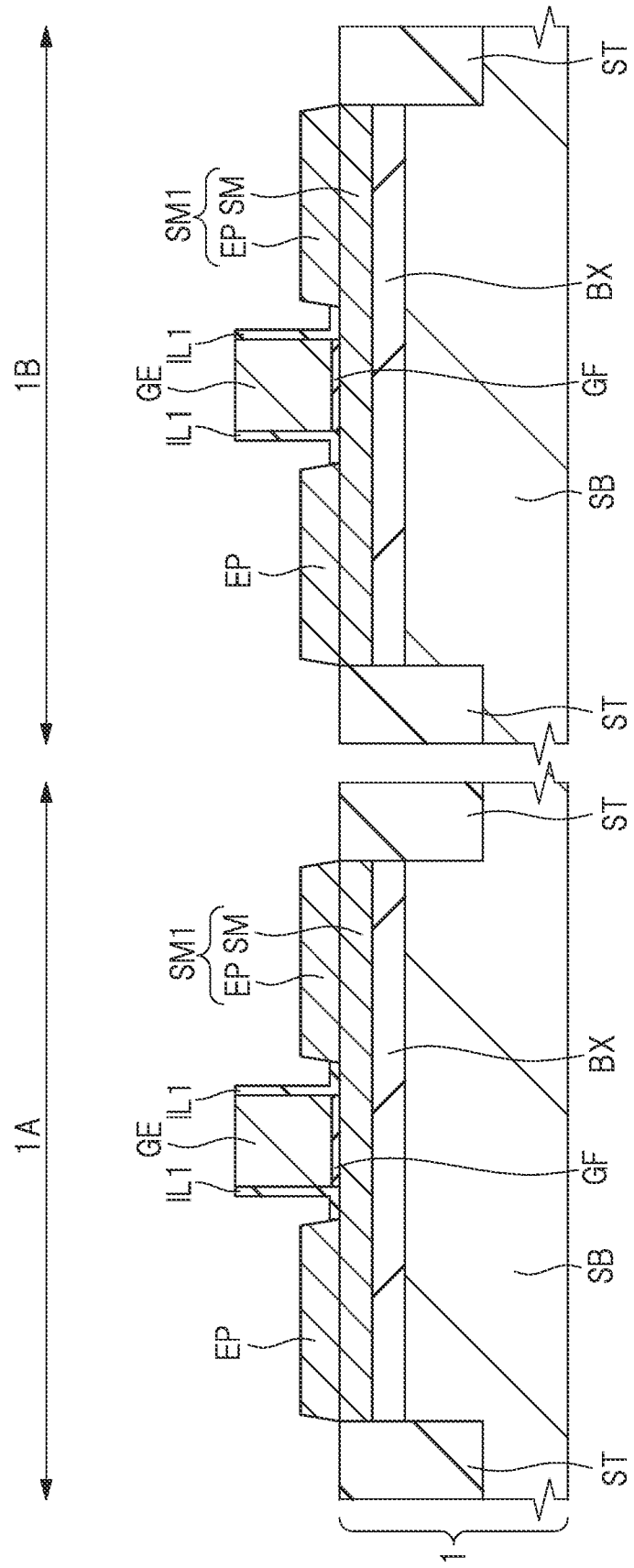
FIG. 7 is a cross-sectional view showing a principal part in the process for manufacturing the semiconductor device subsequent to FIG. 6.

Next, as shown in FIG. 7, the insulating film IL2 composing the sidewall spacer SW1 is removed by etching. At the time of this etching, the insulating film IL1 composing the sidewall spacer SW1 functions as an etching stopper film and remains. At this time, the insulating film CP on the gate electrode GE can also be removed. As another embodiment, it is also possible to remove the entire sidewall spacer SW1.

Figure 8:
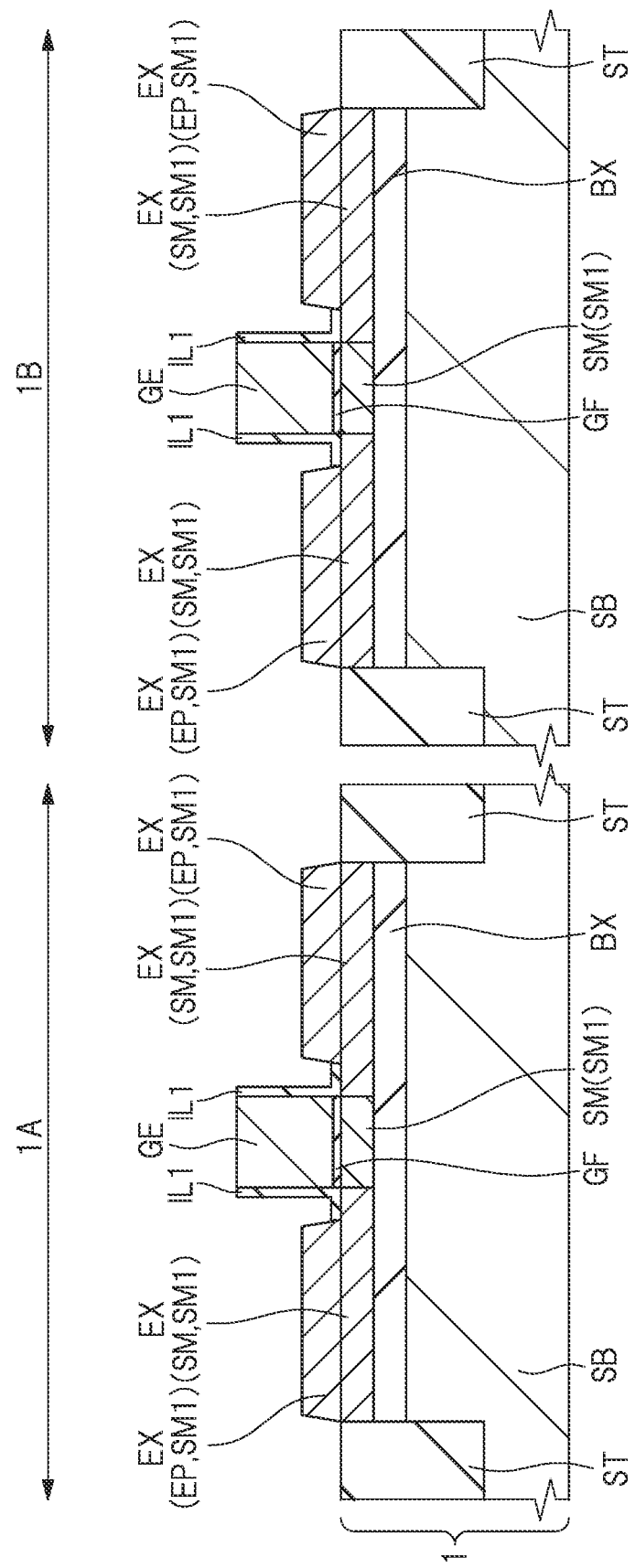
FIG. 8 is a cross-sectional view showing a principal part in the process for manufacturing the semiconductor device subsequent to FIG. 7.

Next, as shown in FIG. 8, in each of the circuit region 1A and the TEG region 1B, an n type impurity such as phosphorus (P) or arsenic (As) is ion-implanted into the region of the semiconductor layer SM1 on both sides of the gate electrode GE, thereby forming an $n^-$ type semiconductor region (extension region, LDD region) EX. In this ion implantation, the gate electrode GE can function as a mask (ion implantation blocking mask).

Figure 9:
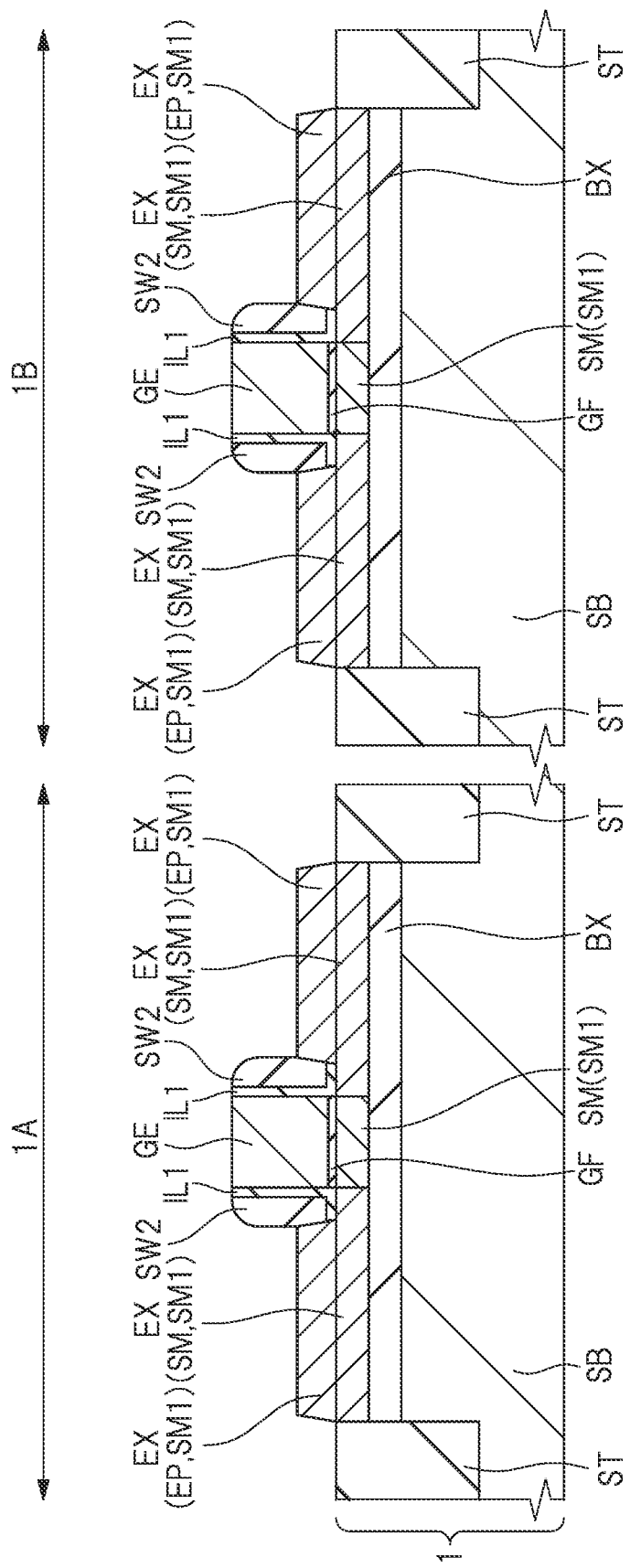
FIG. 9 is a cross-sectional view showing a principal part in the process for manufacturing the semiconductor device subsequent to FIG. 8.

Next, as shown in FIG. 9, a sidewall spacer SW2 is formed as a sidewall insulating film on the sidewall of the gate electrode GE. The sidewall spacer SW2 can be formed by, for example, forming an insulating film for forming the sidewall spacer SW2 on the main surface (entire main surface) of the SOI substrate 1 so as to cover the gate electrode GE and the semiconductor layer EP, and then etching back the insulating film by the anisotropic etching technique. The sidewall spacer SW2 is formed on the SOI substrate 1 in both the circuit region 1A and the TEG region 1B. When the insulating film IL1 remains, the sidewall spacer SW2 is formed on the sidewall of the gate electrode GE via the insulating film IL1, but the combination of the insulating film IL1 and the sidewall spacer SW2 can be regarded also as a sidewall spacer (sidewall insulating film).

Figure 10:
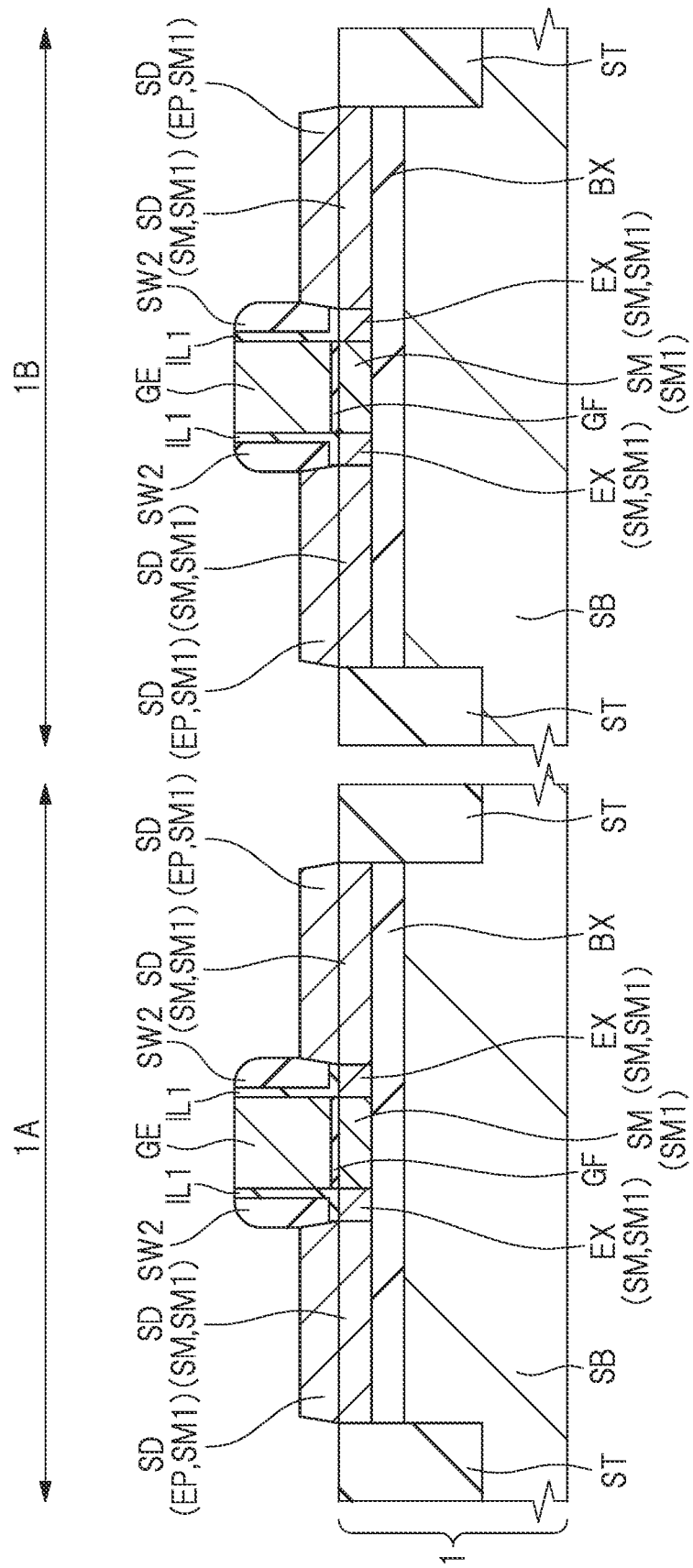
FIG. 10 is a cross-sectional view showing a principal part in the process for manufacturing the semiconductor device subsequent to FIG. 9.

Next, as shown in FIG. 10, in each of the circuit region 1A and the TEG region 1B, an n type impurity such as phosphorus (P) or arsenic (As) is ion-implanted into the region of the semiconductor layer SM1 on both sides of the gate electrode GE and the sidewall spacer SW2, thereby forming an $n^+$ type semiconductor region (source-drain region) SD. In this ion implantation, the gate electrode GE and the sidewall spacer SW2 can function as a mask (ion implantation blocking mask). Note that one of the two (a pair of) $n^+$ type semiconductor regions SD formed on both sides of the gate electrode GE and the sidewall spacer SW2 is the source region composing the MISFET, and the other is the drain region composing the MISFET.

An n type impurity is implanted into the portion of the semiconductor layer SM1 not covered with the gate electrode GE in the ion implantation for forming the $n^-$ type semiconductor region EX, and an n type impurity is implanted into the portion of the semiconductor layer SM1 not covered with the gate electrode GE and the sidewall spacer SW2 in the ion implantation for forming the $n^+$ type semiconductor region SD. The $n^+$ type semiconductor region SD has an impurity concentration higher than that of the $n^-$ type semiconductor region EX. The $n^-$ type semiconductor region EX and the $n^+$ type semiconductor region SD compose the semiconductor region for the source or drain of the MISFET.

The $n^-$ type semiconductor region EX and the $n^+$ type semiconductor region SD formed in the circuit region 1A correspond to the source-drain region of the MISFET 2 composing various circuits, and the $n^-$ type semiconductor region EX and the $n^+$ type semiconductor region SD formed in the TEG region 1B correspond to the source-drain region of the MISFET 3 composing the TEG.

Next, activation annealing which is the heat treatment for activating the impurities introduced into the $n^+$ type semiconductor region SD and the $n^+$ type semiconductor region EX is performed as needed.

Figure 11:
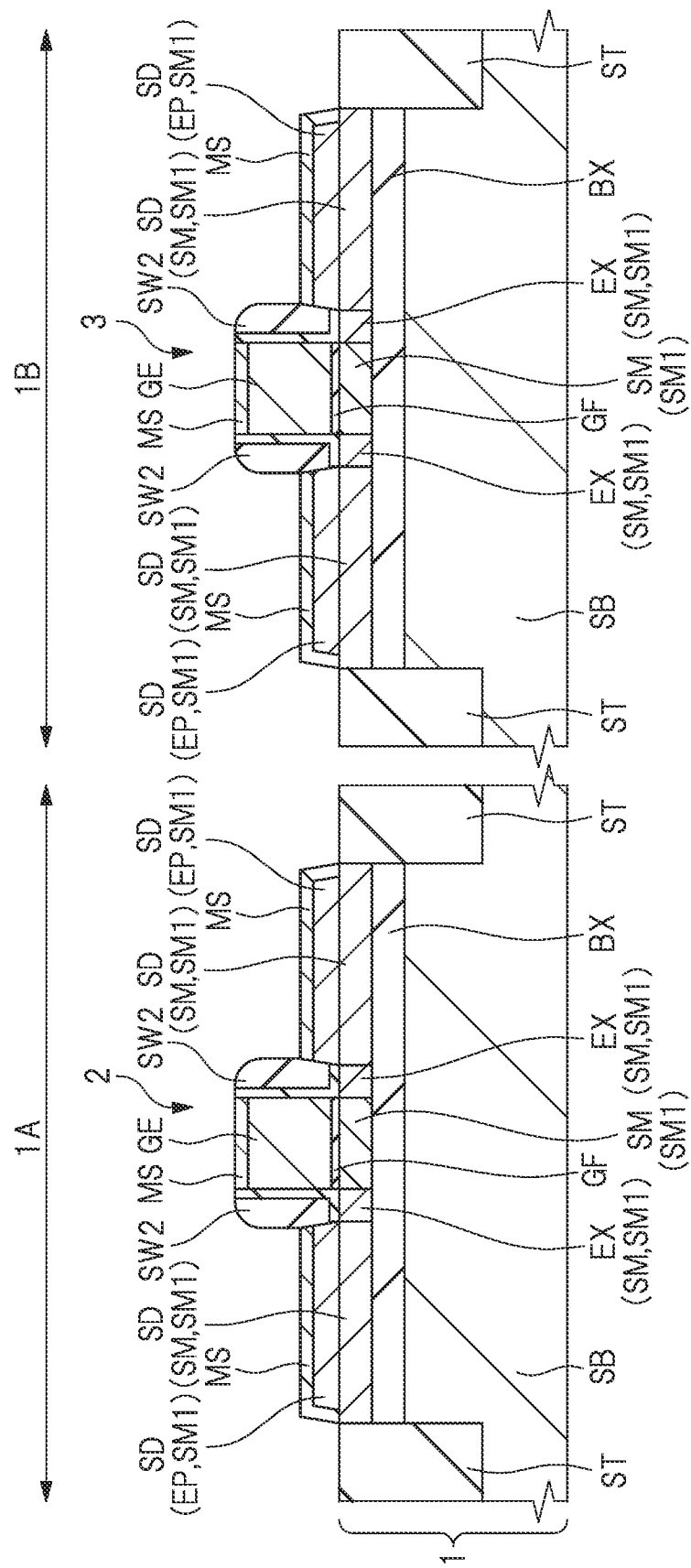
FIG. 11 is a cross-sectional view showing a principal part in the process for manufacturing the semiconductor device subsequent to FIG. 10.

Next, as shown in FIG. 11, a low-resistance metal silicide layer (metal compound layer) MS is formed on each of a surface (upper layer portion) of the $n^+$ type semiconductor region SD, that is, a surface (upper layer portion) of the semiconductor layer EP and a surface (upper layer portion) of the gate electrode GE by the salicide (Self Aligned Silicide) technique.

For example, the step of forming the metal silicide layer MS can be performed as follows. Namely, after forming a metal film on the main surface (entire surface) of the SOI substrate 1 so as to cover the gate electrode GE, the sidewall spacer SW2, and the $n^+$ type semiconductor region SD, the heat treatment is performed, thereby forming the metal silicide layer MS which is a reaction layer (compound layer) of the metal (metal film) and the semiconductor (gate electrode and semiconductor layer EP). Thereafter, the unreacted metal film is removed. The metal silicide layer MS is formed on the SOI substrate 1 in both the circuit region 1A and the TEG region 1B.

In this manner, the MISFET 2 composing various circuits is formed in the circuit region 1A, and the dummy MISFET 3 composing the TEG for VC inspection is formed in the TEG region 1B.

Figure 12:
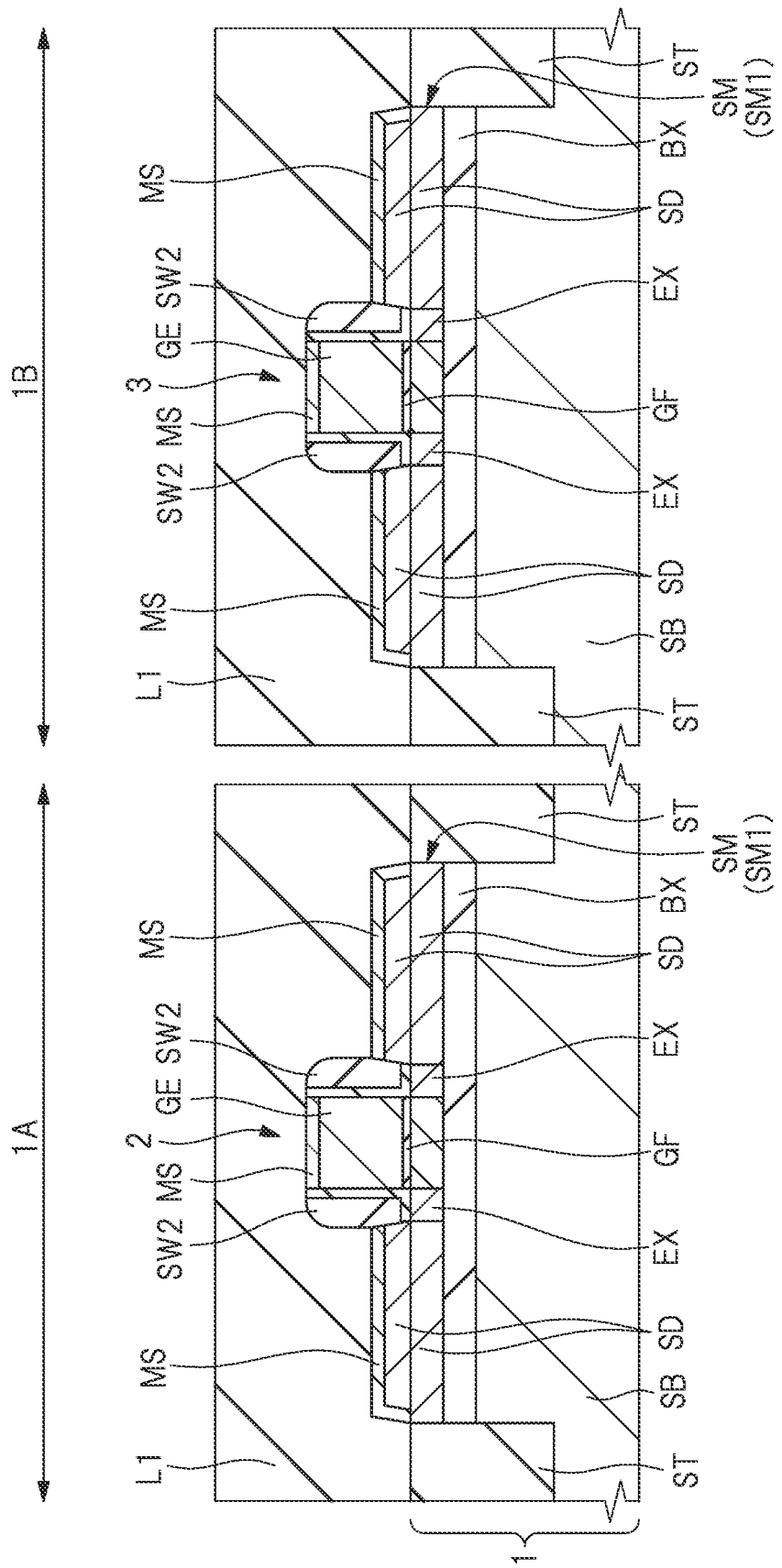
FIG. 12 is a cross-sectional view showing a principal part in the process for manufacturing the semiconductor device subsequent to FIG. 11.

Next, as shown in FIG. 12, an insulating film (interlayer insulating film) L1 as an interlayer insulating film is formed on the main surface (entire main surface) of the SOI substrate 1 so as to cover the gate electrode GE, the semiconductor layer SM1, the sidewall spacer SW2, and the metal silicide layer MS. The insulating film L1 is formed on the entire main surface of the SOI substrate 1, and is thus formed in both the circuit region 1A and the TEG region 1B.

As the insulating film L1, for example, a stacked film of a silicon nitride film and a silicon oxide film on the silicon nitride film (silicon oxide film thicker than the silicon nitride film) or a single film of a silicon oxide film can be used.

After forming the insulating film L1, the flatness of the upper surface of the insulating film L1 may be improved as needed by polishing the upper surface of the insulating film L1 by the CMP method or the like.

Figure 13:
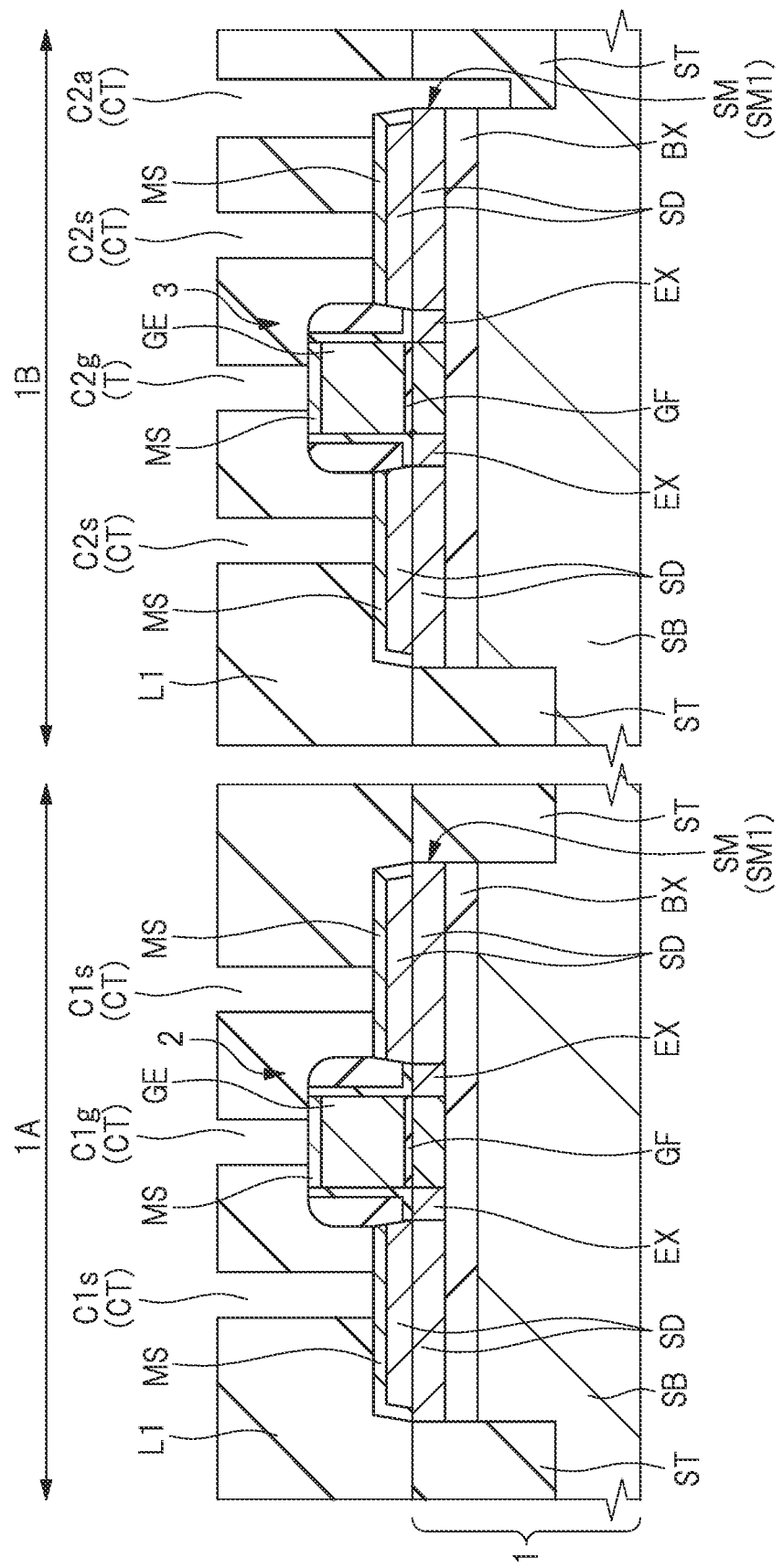
FIG. 13 is a cross-sectional view showing a principal part in the process for manufacturing the semiconductor device subsequent to FIG. 12.

Next, as shown in FIG. 13, the insulating film L1 is etched (preferably dry etching) using the photoresist pattern (not shown) formed on the insulating film L1 as an etching mask, thereby forming a contact hole (through hole, hole) CT in the insulating film L1. The contact hole CT is formed so as to penetrate the insulating film L1. The contact hole CT is formed in the SOI substrate in both the circuit region 1A and the TEG region 1B. The contact hole CT is formed on the gate electrode GE and on the $n^+$ type semiconductor region SD in the circuit region 1A, and the contact hole CT is formed on the gate electrode GE and on the $n^+$ type semiconductor region SD in the TEG region 1B.

Here, the contact hole CT formed on the $n^+$ type semiconductor region SD in the circuit region 1A is denoted with a reference character C1s and is referred to as a contact hole C1s, and the contact hole CT formed on the gate electrode GE in the circuit region 1A is denoted with a reference character C1g and is referred to as a contact hole C1g. Further, the contact hole CT formed on the n⁺ type semiconductor region SD in the TEG region 1B is denoted with a reference character C2s and is referred to as a contact hole C2s, and the contact hole CT formed on the gate electrode GE in the TEG region 1B is denoted with a reference character C2g and is referred to as a contact hole C2g.

The contact holes CT formed in the TEG region 1B include a contact hole CT that reaches the semiconductor substrate SB. In the following, the contact hole CT that reaches the semiconductor substrate SB in the TEG region 1B is denoted with a reference character C2a and is referred to as a contact hole C2a. The contact hole C2a reaches the semiconductor substrate SB and part of the semiconductor substrate SB is exposed at the bottom of the contact hole C2a, but the contact holes C1g, C1s, C2g, and C2s do not reach the semiconductor substrate SB and the semiconductor substrate SB is not exposed in the contact holes C1g, C1s, C2g, and C2s.

In the step of forming the contact hole CT, when the insulating film L1 is etched and the contact hole CT penetrates the insulating film L1, the metal silicide layer MS is exposed at the bottom of the contact hole CT. In the step of forming the contact hole CT, the etching is performed under the condition that the metal silicide layer MS and the semiconductor layers EP and SM are less likely to be etched as compared with the insulating film L1. Therefore, even if the metal silicide layer MS, the semiconductor layer EP, or the semiconductor layer SM is exposed at the bottom of the contact hole CT, they (metal silicide layer MS, semiconductor layer EP, semiconductor layer SM) are hardly etched and remain.

However, the contact hole C2a is formed at a position overlapping the boundary between the element isolation region ST and the semiconductor layer SM (active region) in a plan view. From another point of view, the contact hole C2a is formed at a position where part of the contact hole C2a overlaps the semiconductor layer SM (active region) and the other part overlaps the element isolation region ST in a plan view. Therefore, in the step of forming the contact hole CT, when the insulating film L1 is etched and the contact hole C2a penetrates the insulating film L1, not only the metal silicide layer MS but also the element isolation region ST is exposed at the bottom of the contact hole C2a, and this exposed element isolation region ST can also be etched. This is because, in the step of forming the contact hole CT, the etching is performed under the condition that the element isolation region ST is more likely to be etched as compared with the metal silicide layer MS and the semiconductor layers EP and SM. Therefore, since the element isolation region ST exposed at the bottom of the contact hole C2a is also etched, the depth position of the bottom of the contact hole C2a becomes deeper than the height position of the boundary between the semiconductor substrate SB and the insulating layer BX, so that part of the semiconductor substrate SB is exposed in the vicinity of the bottom of the contact hole C2a.

Note that the contact holes CT formed in the circuit region 1A are all formed at positions that do not overlap the element isolation region ST in a plan view. Therefore, at the bottom of the contact holes C1g and C1s described above, the metal silicide layer MS is exposed, but the semiconductor substrate SB is not exposed. Further, of the contact holes CT formed in the TEG region 1B, the contact holes CT other than the contact hole C2a are formed at positions that do not overlap the element isolation region ST in a plan view. Therefore, at the bottom of the contact holes C2g and C2s described above, the metal silicide layer MS is exposed, but the semiconductor substrate SB is not exposed. On the other hand, of the contact holes CT formed in the TEG region 1B, the contact hole C2a is formed at a position partially overlapping the element isolation region ST in a plan view, so that part of the semiconductor substrate SB is exposed from the contact hole C2a. Therefore, the metal silicide layer MS, the semiconductor layer SM, and the semiconductor substrate SB are exposed from the contact hole C2a.

Figure 14:
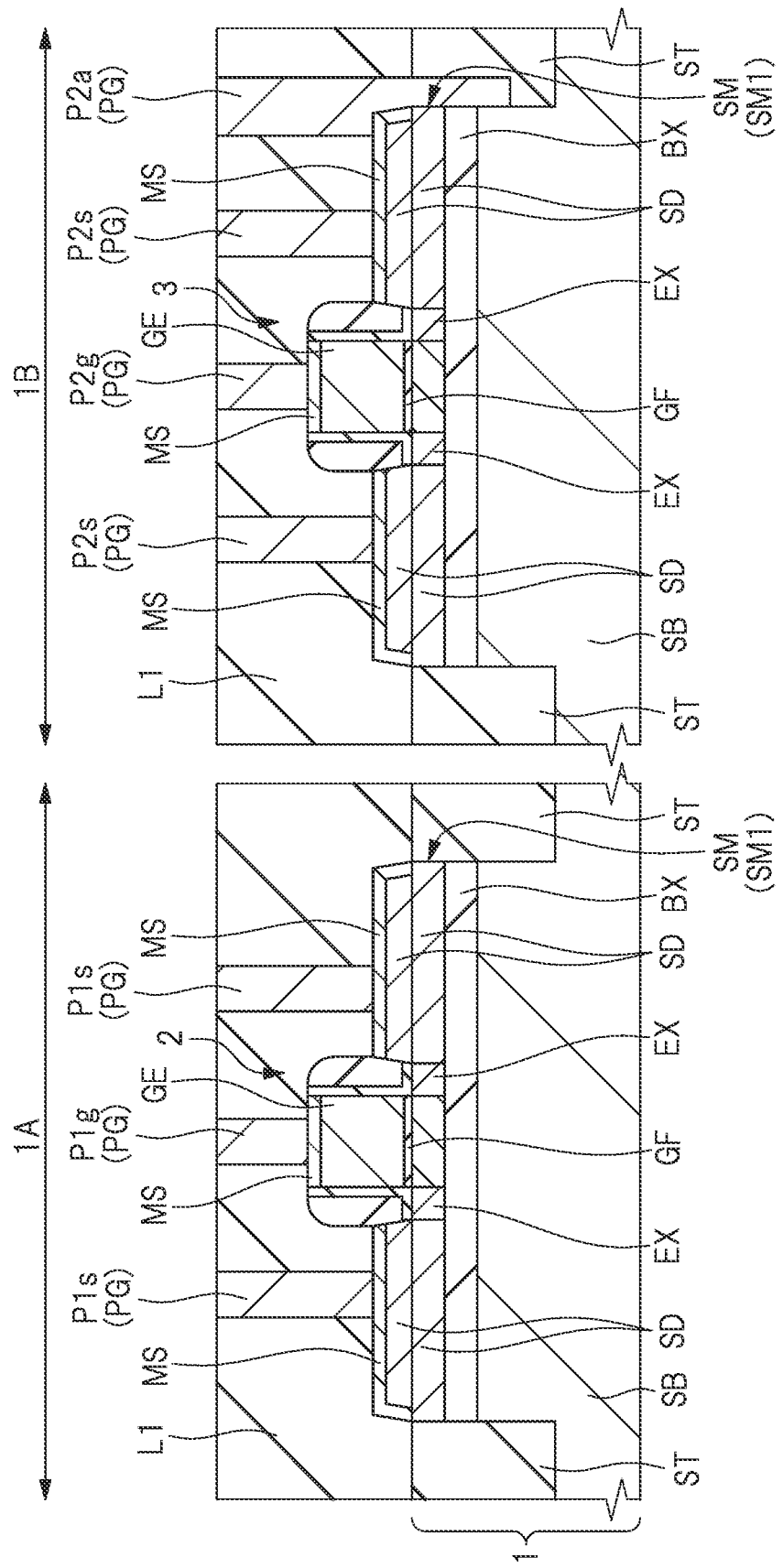
FIG. 14 is a cross-sectional view showing a principal part in the process for manufacturing the semiconductor device subsequent to FIG. 13.

Next, as shown in FIG. 14, a conductive plug (contact plug) PG made of tungsten (W) or the like is formed (buried) in the contact hole CT as a conductor portion for connection. The plug PG can be formed as follows.

In order to form the plug PG, first, a barrier conductor film (for example, titanium film, titanium nitride film, or stacked film thereof) is formed on the insulating film L1 including the inside (bottom and sidewall) of the contact hole CT by the sputtering method or the plasma CVD method. Then, a main conductor film made of a tungsten film or the like is formed on the barrier conductor film by the CVD method or the like so as to fill the contact hole CT. Thereafter, unnecessary main conductor film and barrier conductor film outside the contact hole CT (on the insulating film L1) are removed by the CMP method, the etchback method, or the like. As a result, the upper surface of the insulating film L1 is exposed, and the plug PG composed of the harrier conductor film and the main conductor film that are buried to remain in the contact hole CT is formed. For the sake of simplification of the drawings, FIG. 14 shows the barrier conductor film and the main conductor film composing the plug PG in an integrated manner.

Here, the plug PG buried in the contact hole C1g is denoted with a reference character P1g and is referred to as a plug P1g, and the plug PG buried in the contact hole C1s is denoted with a reference character P1s and is referred to as a plug P1s. Also, the plug PG buried in the contact hole C2g is denoted with a reference character P2g and is referred to as a plug P2g, and the plug PG buried in the contact hole C2s is denoted with a reference character P2s and is referred to as a plug P2s. Further, the plug PG buried in the contact hole C2a is denoted with a reference character P2a and is referred to as a plug P2a. The plugs PG (P2a, P2g, P2s) formed in the TEG region 1B are plugs (contact plugs) composing the TEG for VC inspection.

In the circuit region 1A, the plug P1s buried in the contact hole C1s formed on the n⁺ type semiconductor region SD is in contact with and electrically connected to the metal silicide layer MS on the surface of the n⁺ type semiconductor region SD, at its bottom. Therefore, in the circuit region 1A, the plug P1s is electrically connected to the n⁺ type semiconductor region SD (semiconductor layer SM1) via the metal silicide layer MS on the surface of the n⁺ type semiconductor region SD. Further, in the circuit region 1A, the plug P1g buried in the contact hole C1g formed on the gate electrode GE is in contact with and electrically connected to the metal silicide layer MS on the surface of the gate electrode GE, at its bottom. Therefore, in the circuit region 1A, the plug P1g is electrically connected to the gate electrode GE via the metal silicide layer MS on the surface of the gate electrode GE.

In the TEG region 1B, the plug P2s buried in the contact hole C2s formed on the n⁺ type semiconductor region SD is in contact with and electrically connected to the metal silicide layer MS on the surface of the n⁺ type semiconductor region SD, at its bottom. Therefore, in the TEG region 1B, the plug P2s is electrically connected to the n⁺ type semiconductor region SD (semiconductor layer SM1) via the metal silicide layer MS on the surface of the n⁺ type semiconductor region SD. Also, in the TEG region 1B, the plug P2g buried in the contact hole C2g formed on the gate electrode GE is in contact with and electrically connected to the metal silicide layer MS on the surface of the gate electrode GE, at its bottom. Therefore, in the circuit region 1A, the plug P2g is electrically connected to the gate electrode GE via the metal silicide layer MS on the surface of the gate electrode GE. In addition, in the TEG region 1B, the plug P2a buried in the contact hole C2a is in contact with and electrically connected to the metal silicide layer MS on the surface of the n⁺ type semiconductor region SD and is further in contact with and electrically connected to the semiconductor substrate SB. Therefore, in the TEG region 1B, the plug P2a is electrically connected to the n⁺ type semiconductor region SD (semiconductor layer SM1) via the metal silicide layer MS on the surface of the n⁺ type semiconductor region SD and is further electrically connected to the semiconductor substrate SB. Also, in the contact hole C2a, the side surface of the semiconductor layer SM (the side surface of the semiconductor layer SM composing the n⁺ type semiconductor region SD) is also exposed, so that the plug P2a buried in the contact hole C2a is in contact with the side surface of the semiconductor layer SM and is electrically connected to the semiconductor layer SM. Therefore, the plug P2a is electrically connected to both the n⁺ type semiconductor region SD (semiconductor layer SM1) and the semiconductor substrate SB. Accordingly, in the TEG region 1B, the semiconductor substrate SB and the semiconductor layer SM1 (n⁺ type semiconductor region SD) are electrically connected (short-circuited) via the plug P2a.

The plugs P2g and P2s formed in the TEG region 1B do not reach the semiconductor substrate SB, but the plug P2a formed in the TEG region 1B reaches the semiconductor substrate SB, and the plug P2a electrically connects (short-circuits) the semiconductor layer SM (SM1) and the semiconductor substrate SB in the region 1B. The plugs P1g and P1s formed in the circuit region 1A do not reach the semiconductor substrate SB. In the circuit region 1A, the plug PG that electrically connects (short-circuits) the semiconductor layer SM (SM1) and the semiconductor substrate SB of the SOI substrate 1 is not formed, that is, the plug PG corresponding to the plug P2a is not formed.

Figure 15:
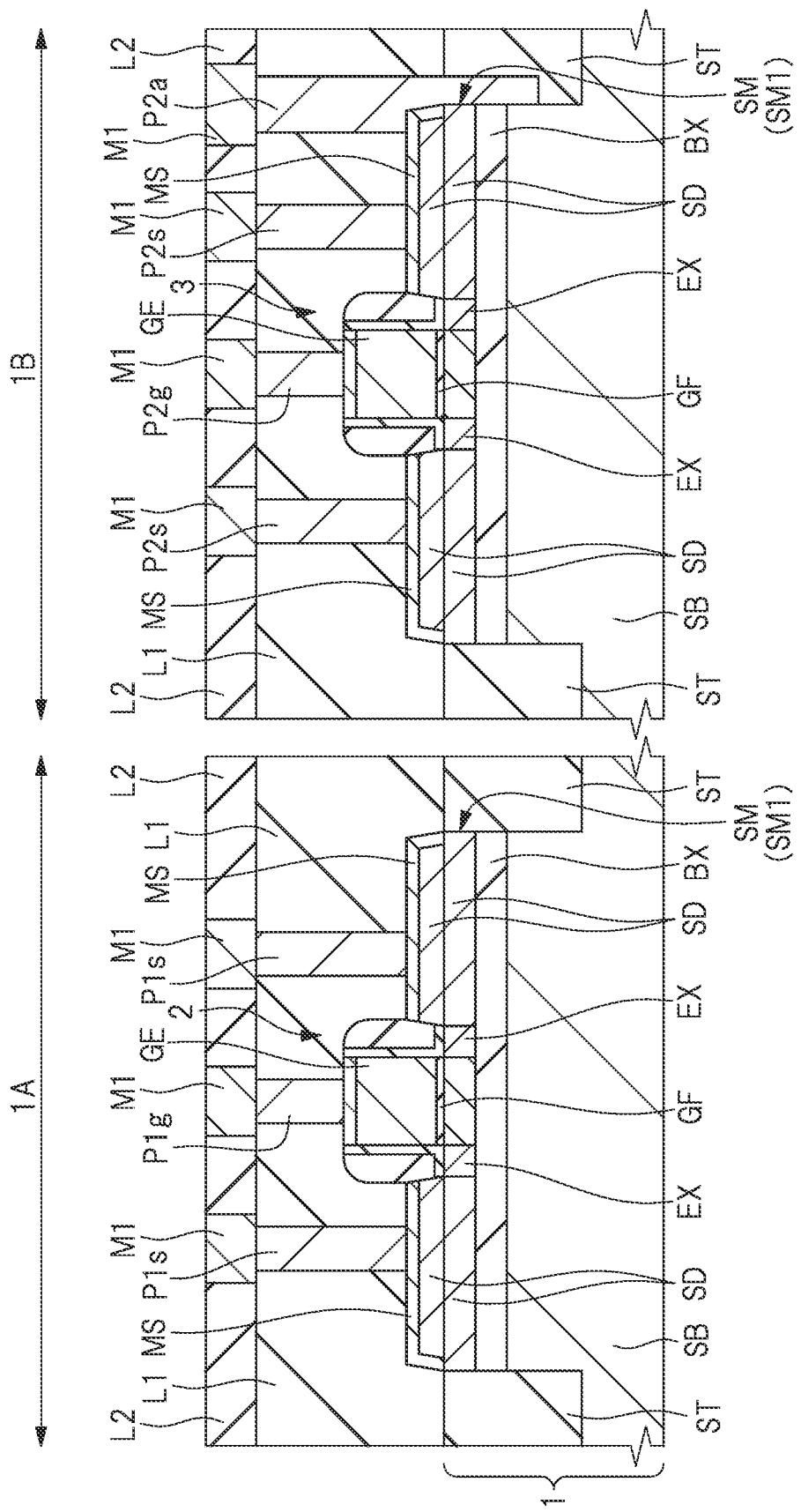
FIG. 15 is a cross-sectional view showing a principal part in the process for manufacturing the semiconductor device subsequent to FIG. 14.

Next, as shown in FIG. 15, an insulating film L2 for wiring formation is formed on the insulating film L1 in which the plug PG has been buried. The insulating film L2 can be a single film (single insulating film) or a stacked film (stacked insulating film).

Next, the first-layer wiring is formed by the single damascene method. First, a wiring trench (trench for burying a wiring M1) is formed in a predetermined region of the insulating film L2 by the dry etching using a photoresist pattern (not shown) as a mask, and then a barrier conductor film (barrier metal film) is formed on the main surface of the SOI substrate 1 (that is, on the insulating film L2 including the bottom and the sidewall of the wiring trench). As the barrier conductor film, for example, a titanium nitride film, a tantalum film, a tantalum nitride film, or the like can be used. Subsequently, a copper seed layer is formed on the barrier conductor film by the CVD method or the sputtering method, and a copper plating film (main conductor film) is further formed on the seed layer by the electrolytic plating method or the like. The inside of the wiring trench is filled with the copper plating film. Then, the copper plating film, the seed layer, and the barrier metal film in the region other than the inside of the wiring trench are removed by the CMP method, thereby forming the first-layer wiring M1 using copper as a main conductive material in the wiring trench. For the sake of simplification of the drawings, the copper plating film, the seed layer, and the barrier metal film composing the wiring M1 are shown in an integrated manner in FIG. 15. The wiring M1 is connected to the plug PG, and is electrically connected to the n⁺ type semiconductor region SD, the gate electrode GE, or the like via the plug PG. The wiring M1 connected to the plug P2a is electrically connected to both the semiconductor layer SM1 (n⁺ type semiconductor region SD) and the semiconductor substrate SB via the plug P2a.

Figure 16:
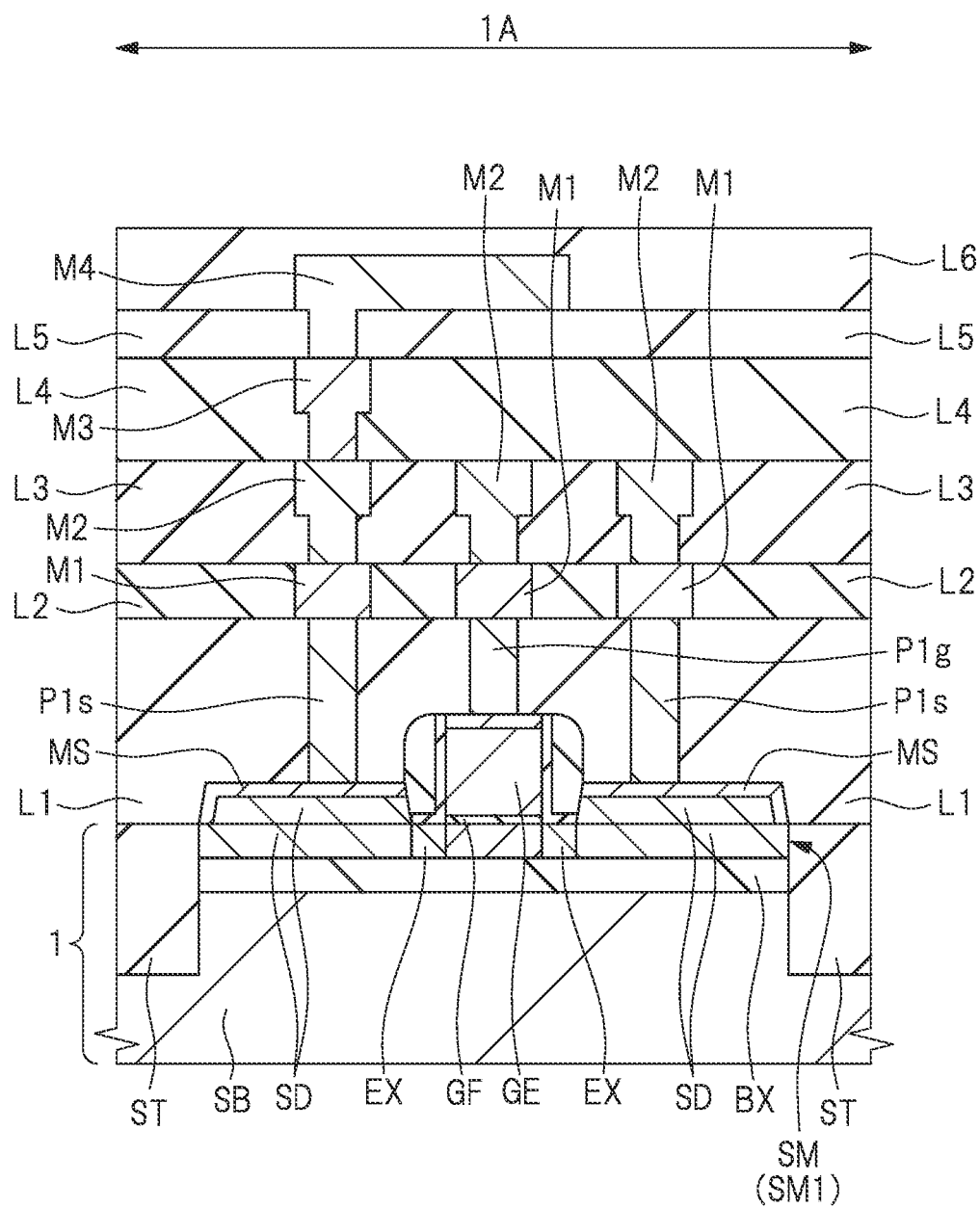
FIG. 16 is a cross-sectional view showing a principal part in the process for manufacturing the semiconductor device subsequent to FIG. 15.
Figure 17:
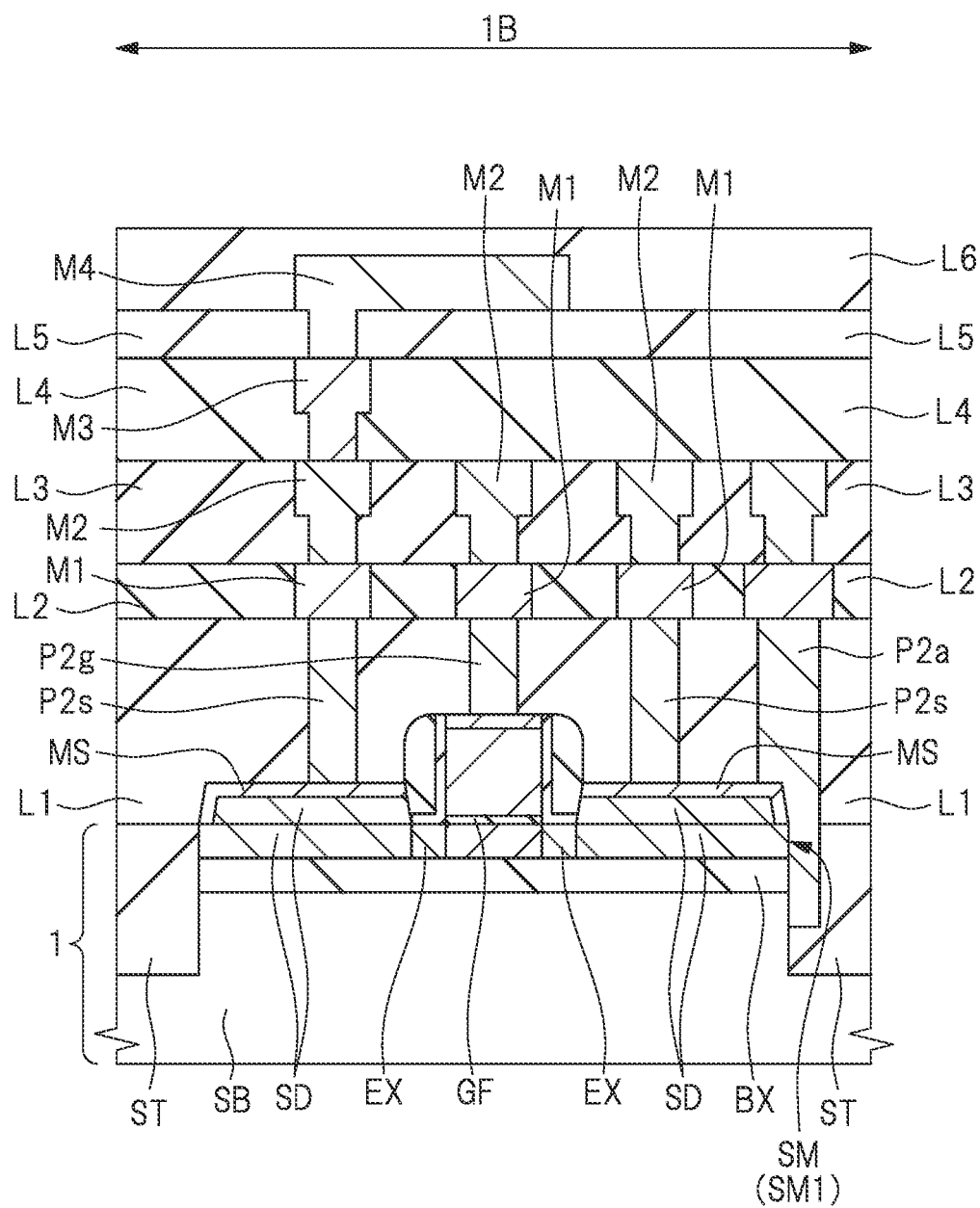
FIG. 17 is a cross-sectional view showing a principal part in the process for manufacturing the semiconductor device subsequent to FIG. 15.

Next, as shown in FIG. 16 and FIG. 17, the step of forming the interlayer insulating film and the step of forming the wiring are repeated as necessary. Consequently, a multilayer wiring structure including a plurality of wiring layers is formed. In the case of FIG. 16 and FIG. 17, the insulating films (interlayer insulating films) L3, L4, and L5, the second-layer wiring (second wiring layer) M2, the third-layer wiring (third wiring layer) M3, and the fourth-layer wiring (fourth wiring layer) M4 are formed. In this case, the step of forming the insulating film L3, the step of forming the wiring M2, the step of forming the insulating film L4, the step of forming the wiring M3, the step of forming the insulating film L5, and the step of forming the wiring M4 may be performed in this order. The fourth-layer wiring M4 corresponds to the wiring of the uppermost layer, and the bonding pad can also be formed by the wiring M4.

Next, as shown in FIG. 16 and FIG. 17, an insulating film L6 as a passivation film (protective film) is formed on the insulating film L5 so as to cover the wiring M4. Then, an opening (not shown) for the bonding pad is formed in the insulating film L6. Consequently, the front-end process (wafer process) is completed.

Thereafter, a dicing process is performed to cut or dice the SOI substrate 1 with a dicing saw or the like along the scribe region SR including the TEG region 1B. Consequently, the SOI substrate 1 is cut and separated into individual chip regions CR. Each of the singulated chip regions CR becomes a semiconductor device (semiconductor chip). Since the SOI substrate 1 and the stacked structure on the SOI substrate 1 are cut at the scribe region SR, the scribe region SR including the TEG region 1B is cut and removed. The cut surface by dicing becomes the side surface of the semiconductor device (semiconductor chip). Since the circuit region 1A is included in the chip region CR, it is included in the manufactured semiconductor device (semiconductor chip).

The TEG (Test Elemental Group) in the TEG region 1B is provided to inspect the connection failure of the plug PG by the VC inspection. In order to detect a defect (connection failure of the plug PG) that may occur in the circuit region 1A remaining on the semiconductor chip even after the dicing process, a MISFET is formed in the TEG region 1B in the same manner as the circuit region 1A, and the plug PG is connected to this MISFET.

In the first embodiment, the VC (Voltage contrast) inspection can be performed using the TEG formed in the TEG region 1B. By the VC inspection, it is possible to inspect (detect) the formation failure of the plug PG.

When the defect of the plug PG is found by the VC inspection, the occurrence of the defect can be prevented by feeding back the inspection result to the manufacturing process. Also, when the defect of the plug PG is found by the VC inspection, it is possible to prevent the manufacture of the product having the defect by stopping the manufacture using the SOI substrate in which the defect has been found. In this manner, it is possible to improve the reliability of the semiconductor device.

The VC inspection can be performed at any timing after the step of forming the plug PG and before the dicing process. For example, the VC inspection can be performed after the front-end process (wafer process) is ended and before the dicing process is performed. As another embodiment, the VC inspection can be performed after forming the plug PG and before forming the insulating film L2 covering the plug PG. Alternatively, the VC inspection can be performed after forming the wiring M1 and before forming the insulating film L3 covering the wiring M1. Also, it is not always necessary to perform the manufacturing process after the VC inspection (for example, the dicing process) for the SOI substrate 1 to which the VC inspection has been performed.

Background of Study

Figure 18:
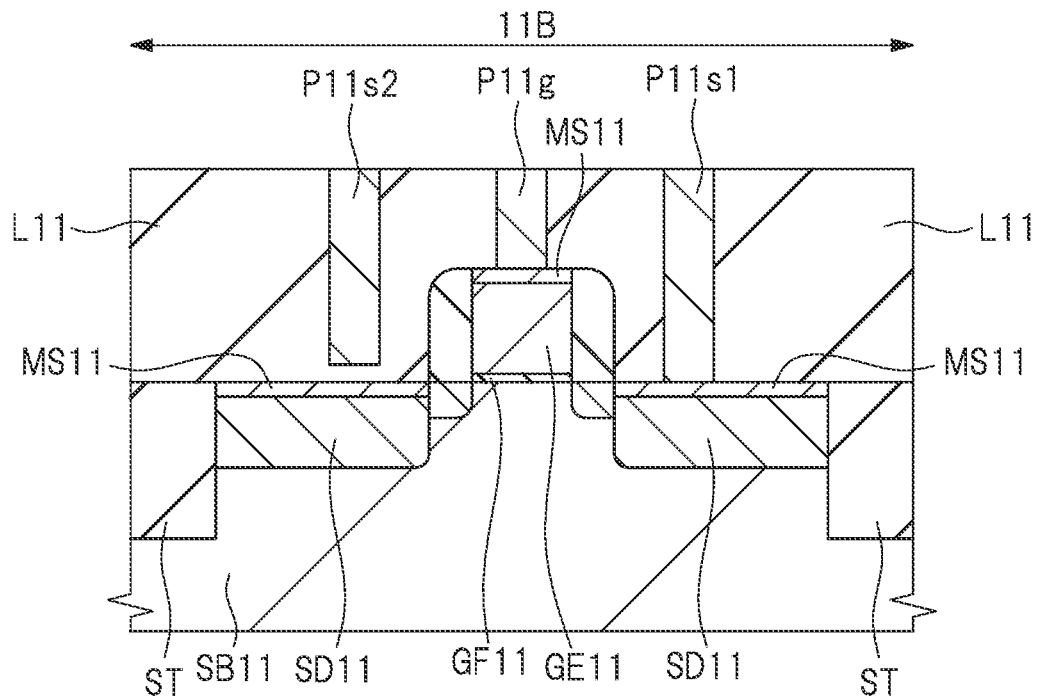
FIG. 18 is a cross-sectional view showing a principal part in the process for manufacturing the semiconductor device according to the first studied example.

FIG. 18 is a cross-sectional view showing a principal part in the process for manufacturing the semiconductor device according to the first studied example studied by the inventors.

In the case of the first studied example, as can be seen from FIG. 18, a normal semiconductor substrate (single crystal silicon substrate) SB11 is used instead of an SOI substrate. As shown in FIG. 18, in a TEG region 11B, a gate electrode GE11 is formed on the semiconductor substrate SB11 via a gate insulating film GF11, and an $n^+$ type semiconductor region SD11 for source or drain is formed in a region of the semiconductor substrate SB11 on both sides of the gate electrode GE11. A metal silicide layer MS11 is formed on a surface of the gate electrode GE11 and a surface of the $n^+$ type semiconductor region SD11. An interlayer insulating film L11 is formed on the semiconductor substrate SB11 so as to cover the gate electrode GE11. Contact holes are formed in the interlayer insulating film L11, and conductive plugs (contact plugs) P11g, P11s1, and P11s2 are buried in the contact holes. The plugs P11s1 and P11s2 are formed on the $n^+$ type semiconductor region SD11 so as to be electrically connected to the $n^+$ type semiconductor region SD11, and the plug P11g is formed on the gate electrode GE11 so as to be electrically connected to the gate electrode GE11.

Here, the plug P11s1 shown in FIG. 18 is properly formed and is in contact with the metal silicide layer MS11 on $n^+$ type semiconductor region SD11, and is thus accurately electrically connected to the $n^+$ type semiconductor region SD11 (semiconductor substrate SB11). Namely, the plug P11s1 is normally connected to the semiconductor substrate SB11 ($n^+$ type semiconductor region SD11). On the other hand, since the formation failure occurs in the plug P11s2 shown in FIG. 18, the plug P11s2 is not in contact with the metal silicide layer MS11 on the $n^+$ type semiconductor region SD11 and is not electrically connected to the semiconductor substrate SB11 ($n^+$ type semiconductor region SD11). Namely, the connection of the plug P11s2 to the semiconductor substrate SB11 ($n^+$ type semiconductor region SD11) is not sufficient. The formation failure of the plug may occur due to, for example, the formation failure of the contact hole, the defective filling of the contact hole by the conductive film (conductive film for forming the plug), or the like.

In the VC inspection, the TEG to be the target (TEG formed in the TEG region 11B) is irradiated with electron beam. In the case of the first studied example, when irradiated with electron beam in the VC inspection, the plug P11s1 normally connected to the semiconductor substrate SB11 ($n^+$ type semiconductor region SD11) is charged with a positive charge, so that the electrons in the semiconductor substrate SB11 are released through the plug P11s1. At this time, since the plug P11s1 emits light, it is possible to confirm that the plug P11s1 is normally connected to the semiconductor substrate SB11 ($n^+$ type semiconductor region SD11) by detecting this light. On the other hand, since electrons do not flow through the plug P11s2 which is not sufficiently connected to the semiconductor substrate SB11 ($n^+$ type semiconductor region SD11) and the plug P11s2 does not emit light, it is possible to detect the defect of the plug P11s2 by confirming that the portion where the plug P11s2 is formed does not emit light. In this manner, it is possible to confirm whether or not the plugs P11s1 and P11s2 are normally formed, by the VC inspection.

In addition, the gate electrode GE11 is insulated from the semiconductor substrate SB11 via the gate insulating film GF11. Therefore, since the plug P11g connected to the gate electrode GE11 essentially has no electrical connection to the semiconductor substrate SB11, the plug P11g does not emit light even if it is irradiated with electron beam in the VC inspection. However, when the gate electrode GE11 is short-circuited with the semiconductor substrate SB11 due to formation failure of the gate insulating film GF11 or the like, the plug P11g connected to the gate electrode GE11 is in the state of being electrically connected to the semiconductor substrate SB11. Therefore, when irradiated with electron beam in the VC inspection, the plug P11g emits light. In this manner, by confirming the light emission of the plug P11g connected to the gate electrode GE11 in the VC inspection, it is possible to confirm whether or not the gate electrode GE11 short-circuited with the semiconductor substrate SB11.

Figure 19:
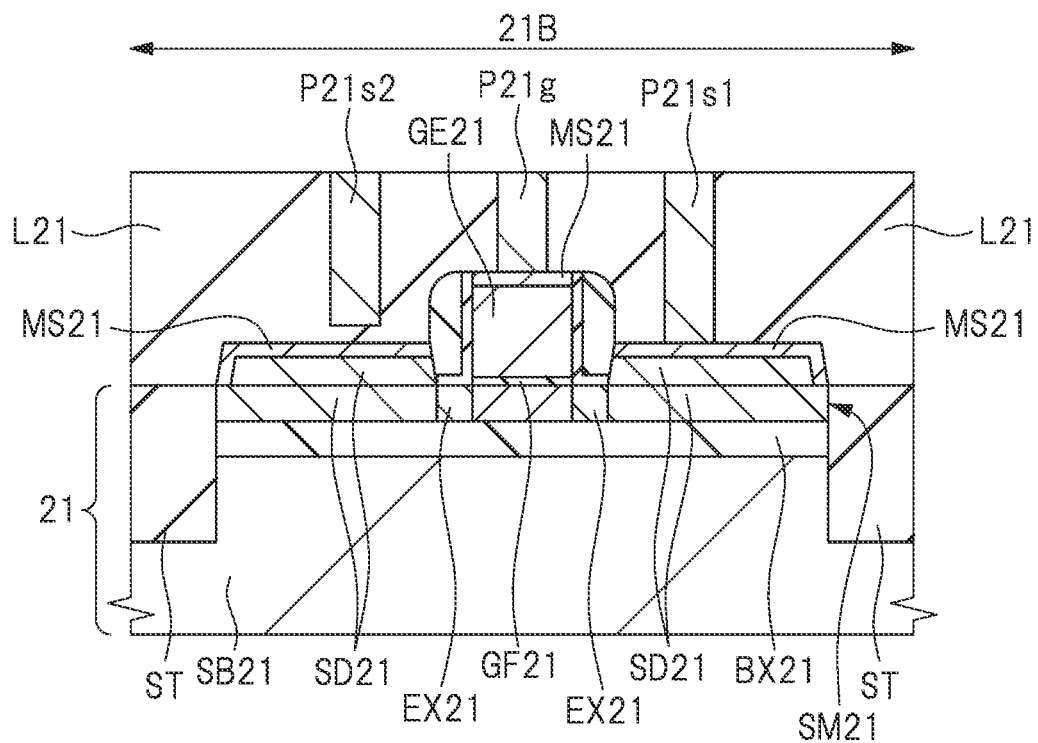
FIG. 19 is a cross-sectional view showing a principal part in the process for manufacturing the semiconductor device according to the second studied example.

FIG. 19 is a cross-sectional view showing a principal part in the process for manufacturing the semiconductor device according to the second studied example studied by the inventors.

In the case of the second studied example, as can be seen from FIG. 19, an SOI substrate 21 is used. As shown in FIG. 19, in a TEG region 21B, a gate electrode GE21 is formed on the SOI substrate 21 via a gate insulating film GF21, and an $n^+$ type semiconductor region SD21 for source or drain is formed in a region of a semiconductor layer SM21 of the SOI substrate 21 on both sides of the gate electrode GE21. A metal silicide layer MS21 is formed on a surface of the gate electrode GE21 and a surface of the $n^+$ type semiconductor region SD21. An interlayer insulating film L21 is formed on the SOI substrate 21 so as to cover the gate electrode GE21. Contact holes are formed in the interlayer insulating film L21, and conductive plugs (contact plugs) P21g, P21s1 and, P21s2 are buried in the contact holes. The plugs P21s1 and P21s2 are formed on the $n^+$ type semiconductor region SD21 so as to be electrically connected to the $n^+$ type semiconductor region SD21, and the plug P21g is formed on the gate electrode GE21 so as to be electrically connected to the gate electrode GE21.

Here, the plug P21s1 shown in FIG. 19 is properly formed and is in contact with the metal silicide layer MS21 on $n^+$ type semiconductor region SD21, and is thus accurately electrically connected to the $n^+$ type semiconductor region SD21 (semiconductor layer SM21 of SOI substrate 21). Namely, the plug P21s1 is normally connected to the semiconductor layer SM21 ($n^+$ type semiconductor region SD21) of the SOI substrate 21. On the other hand, since the formation failure occurs in the plug P21s2 shown in FIG. 19, the plug P21s2 is not in contact with the metal silicide layer MS21 on the $n^+$ type semiconductor region SD21 and is not electrically connected to the semiconductor layer SM21 ($n^+$ type semiconductor region SD21) of the SOI substrate 21. Namely, the connection of the plug P21s2 to the semiconductor layer SM21 ($n^+$ type semiconductor region SD21) of the SOI substrate 21 is not sufficient.

In the VC inspection, the TEG to be the target (TEG formed in the TEG region 21B) is irradiated with electron beam. In the case of the second studied example, even when irradiated with electron beam in the VC inspection, current flowing from the semiconductor layer SM21 of the SOI substrate 21 to the normal plug P21s1 is small, and the plug P21s1 hardly emits light. This is because the semiconductor layer SM21 and the semiconductor substrate SB21 of the SOI substrate 21 are insulated by the insulating layer BX21 and the amount of electrons in the semiconductor layer SM21 is limited, so that the amount of current flowing from the semiconductor layer SM21 into the plug P21s1 irradiated with the electron beam is small even if the plug P21s1 is normally connected to the semiconductor layer SM21 of the SOI substrate 21. Further, in the case of the second studded example, even when irradiated with electron beam in the VC inspection, the electrons do not flow through the plug P21s2 which is not sufficiently connected to the semiconductor layer SM21 of the SOI substrate 21, and the plug P21s2 does not emit light. Therefore, in the case of the second studied example, even if the VC inspection is performed to the TEG formed on the SOI substrate, it is difficult to distinguish between the normal plug P21s1 and the abnormal plug P21s2, and the accuracy of the VC inspection is degraded. This may reduce the reliability of the semiconductor device.

In addition, in the case of the second studied example, the plug P21g connected to the gate electrode GE21 does not emit light even when irradiated with electron beam in the VC inspection, regardless of whether or not the gate electrode GE21 is short-circuited with the semiconductor layer SM21 of the SOI substrate 21. Therefore, it is difficult to confirm whether or not the gate electrode GE21 is short-circuited with the semiconductor layer SM21 of the SOI substrate 21 in the VC inspection. This may reduce the reliability of the semiconductor device.

Main Feature and Effect of First Embodiment

Figure 20:
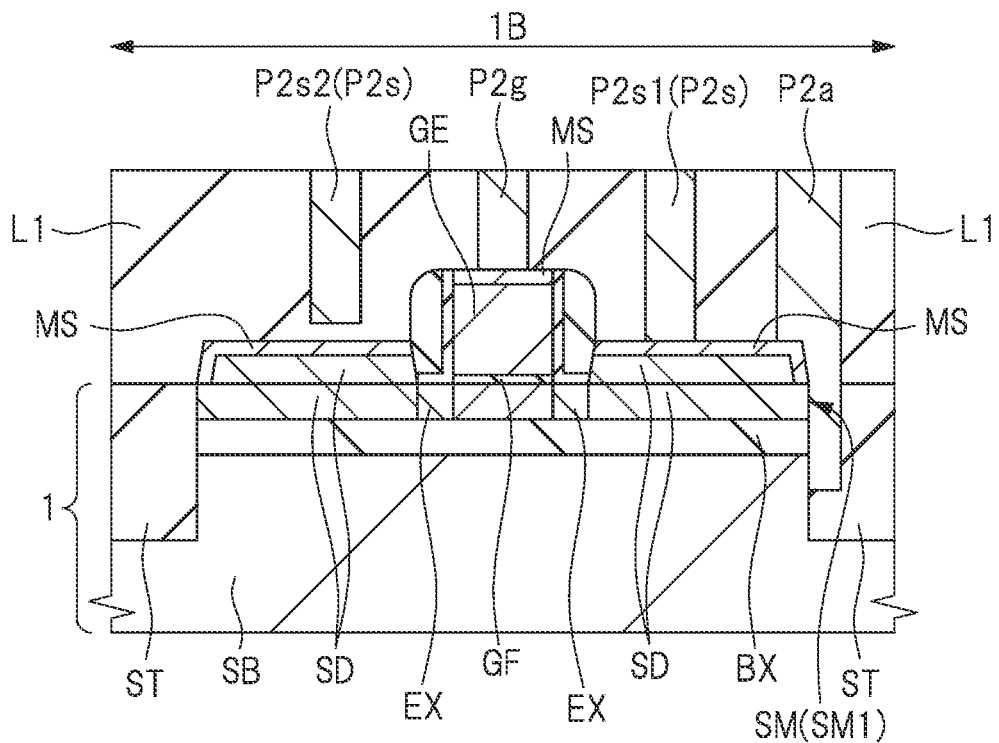
FIG. 20 is a cross-sectional view showing principal part in the process for manufacturing the semiconductor device according to the embodiment (first embodiment).

Next, the VC inspection in the first embodiment will be described with reference to FIG. 20. FIG. 20 is a cross-sectional view showing a principal part in the process for manufacturing the semiconductor device according to the first embodiment and shows the cross-section corresponding to the cross-section of the TEG region 1B in FIG. 14, but is different from FIG. 14 in the following points.

FIG. 20 shows plugs P2s1 and P2s2 corresponding to the plug P2s in FIG. 14. Of these, the plug P2s1 is properly formed and is in contact with the metal silicide layer MS on the $n^+$ type semiconductor region SD, and is thus accurately electrically connected to the $n^+$ type semiconductor region SD (semiconductor layer SM1 of SOI substrate 1). Namely, the plug P2s1 is normally connected to the semiconductor layer SM1 ($n^+$ type semiconductor region SD) of the SOI substrate 1. On the other hand, since the formation failure occurs in the plug P2s2 shown in FIG. 20, the plug P2s2 is not in contact with the metal silicide layer MS on the $n^+$ type semiconductor region SD and is not electrically connected to the semiconductor layer SM1 ($n^+$ type semiconductor region SD) of the SOI substrate 1. Namely, the connection of the plug P2s2 to the semiconductor layer SM1 ($n^+$ type semiconductor region SD) of the SOI substrate 1 is not sufficient.

In the VC inspection, the TEG to be the target (TEG formed in the TEG region 1B) is irradiated with electron beam. When irradiated with electron beam in the VC inspection, the plug P2s1 normally connected to the semiconductor layer SM1 ($n^+$ type semiconductor region SD) of the SOI substrate 1 is charged with a positive charge, so that the electrons are released from the semiconductor layer SM1 through the plug P2s1. In the case of the first embodiment, since the semiconductor substrate SB and the semiconductor layer SM1 ($n^+$ type semiconductor region SD) are electrically connected to each other via the plug P2a in the TEG region 1B, not only electrons in the semiconductor layer SM1 but also electrons in the semiconductor substrate SB are released through the plug P2s1 when irradiated with electron beam in the VC inspection. At this time, since the plug P2s1 emits light, it is possible to confirm that the plug P2s1 is normally connected to the semiconductor layer SM1 ($n^+$ type semiconductor region SD), by detecting this light. In the first embodiment, since the semiconductor substrate SB and the semiconductor layer SM1 ($n^+$ type semiconductor region SD) are electrically to each other via the plug P2a in the TEG region 1B, it is possible to sufficiently ensure the amount of current flowing from the semiconductor layer SM1 of the SOI substrate 1 to the normal plug P2s1 when irradiated with electron beam in the VC inspection. Accordingly, it is possible to sufficiently ensure the light emission amount (light emission intensity) of the normal plug P2s1 in the VC inspection. On the other hand, since electrons do not flow through the plug P2s2 which is not sufficiently connected to the semiconductor layer SM1 ($n^+$ type semiconductor region SD) of the SOI substrate 1 and the plug P2s2 does not emit light, it is possible to detect the defect of the plug P2s2 by confirming that the portion where the plug P2s2 is formed does not emit light. In this manner, it is possible to confirm whether or not the plugs P2s1 and P2s2 are normally formed, by the VC inspection.

Namely, in the case of the second studied example described above, since the semiconductor layer SM21 and the semiconductor substrate SB21 are insulated by the insulating layer BX21 in the TEG region 21B, the amount of current flowing to the normal plug P21s1 from the semiconductor layer SM21 in the VC inspection is small, and it is not possible to sufficiently ensure the light emission amount. (light emission intensity) of the normal plug P21s1. On the other hand, in the first embodiment, since the semiconductor layer SM1 and the semiconductor substrate SB are electrically connected via the plug P2s in the TEG region 1B, it is possible to sufficiently endure the amount of current flowing from the semiconductor layer SM1 to the normal plug P2s1 in the VC inspection, and it is thus possible to sufficiently ensure the light emission amount (light emission intensity) of the normal plug P2s1. Therefore, it is possible to more accurately confirm whether or not the plug P2s (P2s1, P2s2) is normally formed, by the VC inspection.

For example, the determination as to whether or not the plug P2s is normally formed (that is, whether the plug P2s is normally connected to the semiconductor layer SM1) can be made by visually confirming the image of the plug P2s taken in the VC inspection to check the contrast between the light emission (light portion) of the normal plug that emits light and the non-conducting plug (dark portion) that emits no light.

As described above, by detecting the presence/absence of the connection failure of the plug P2s in the TEG region 1B, it is possible to estimate the presence/absence of the occurrence of the connection failure of the plug P1s in the circuit region 1A. Therefore, since it is possible to accurately perform the VC inspection using the TEG formed in the TEG region, the reliability of the semiconductor device including the TEG used for the VC inspection can be improved. Further, the reliability of the semiconductor device manufactured thereafter can be improved by feeding back the result of VC inspection to the manufacturing process.

Also, the gate electrode is insulated from the semiconductor layer SM via the gate insulating film GF. Therefore, since the plug P1g connected to the gate electrode GE essentially has no electrical connection to the semiconductor layer SM in the TEG region 1B, the plug P1g does not emit light even if it is irradiated with electron beam in the VC inspection. However, when the gate electrode GE is short-circuited with the semiconductor layer SM due to formation failure of the gate insulating film GF or the like, the plug P1g connected to the gate electrode GE is in the state of being electrically connected (short-circuited) to the semiconductor layer SM. Therefore, when irradiated with electron beam in the VC inspection, the plug P1g emits light. In the first embodiment, since the semiconductor layer SM and the semiconductor substrate SB are electrically connected via the plug P2a in the TEG region 1B, it is possible to sufficiently ensure the light emission amount (light emission intensity) in the VC inspection as to the plug P1g that is short-circuited with the semiconductor layer SM. Accordingly, it is possible to more accurately determine whether or not the gate electrode GE is short-circuited with the semiconductor layer SM, by confirming the light emission of the plug P1g connected to the gate electrode GE in the VC inspection.

Figure 21:
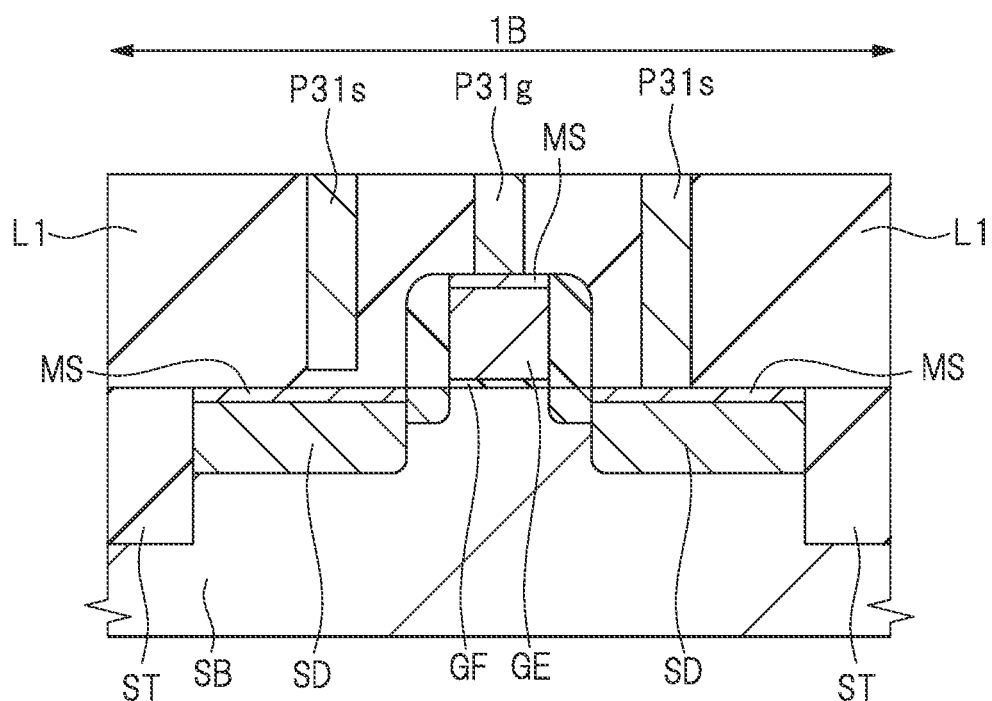
FIG. 21 is a cross-sectional view showing a principal part in the process for manufacturing the semiconductor device according to the third studied example.

Here, the case where the semiconductor layer SM and the insulating layer BX are removed in the TEG region 1B and the TEG is formed in the removal region unlike the first embodiment is assumed and this case is referred to as the third studied example. FIG. 21 is a cross-sectional view showing the third studied example.

In the case of the third studied example, as shown in FIG. 21, the MISFET composing the TEG is formed on the semiconductor substrate SB in the TEG region 1B. Namely, as shown in FIG. 21, the semiconductor layer SM and the insulating layer BX are removed in the TEG region 1B, the gate electrode GE is formed on the semiconductor substrate SB via the gate insulating film GF, and the $n^+$ type semiconductor region SD is formed in the semiconductor substrate SB. Therefore, in the case of the third studied example (FIG. 21), the structure of the TEG region 1B is almost the same as the structure of the first studied example (FIG. 18), a plug P31g corresponding to the plug P2g is connected to the gate electrode GE, and a plug P31g corresponding to the plug P2s is connected to the semiconductor substrate SB instead of the semiconductor layer SM. Accordingly, it is possible to ensure the light emission amount (light emission intensity) in the VC inspection.

However, in the case of the third studied example, in the circuit region 1A, a semiconductor element such as a MISFET is formed in the region in which the SOI structure is maintained as in the circuit region 1A of FIG. 14. On the other hand, in the TEG region 1B, the TEG is formed in the region from which the semiconductor layer SM and the insulating layer BX have been removed as shown in FIG. 21. Therefore, in the case of the third studied example, the plug P1s is connected to the semiconductor layer SM in the circuit region 1A as shown in FIG. 14, while the plug P31s is connected to the semiconductor substrate SB instead of the semiconductor layer SM in the TEG region 1B as shown in FIG. 21. Therefore, the plug P1s in the circuit region 1A and the plug P31s in the TEG region 1B are different in the objects to be connected. Accordingly, even if it is possible to confirm by the VC inspection whether or not the plug P31s (see FIG. 21) in the TEG region 1B is normally formed, it is difficult to accurately estimate whether or not the plug P1s (see FIG. 14) in the circuit region 1A is normally formed based on the result, and its reliability is limited. It is essentially preferable that the plug to be the target of the VC inspection (the plug composing the TEG) has the configuration similar to that of the plug composing the circuit in the circuit region 1A.

On the other hand, in the first embodiment, in the circuit region 1A, a semiconductor element such as a MISFET is formed in the region where the SOI structure of the SOI substrate 1 is maintained. On the other hand, in the TEG region 1B, the TEG is formed in the region where the SOI structure of the SOI substrate 1 is maintained. Namely, in the first embodiment, in the circuit region 1A, a semiconductor element such as a MISFET is formed in the region where the semiconductor substrate SB, the insulating layer BX on the semiconductor substrate SB, and the semiconductor layer SM on the insulating layer substrate BX are present. Also, in the TEG region 1B, the TEG (MISFET composing the TEG) is formed in the region where the semiconductor substrate SB, the insulating layer BX on the semiconductor substrate SB, and the semiconductor layer SM on the insulating layer BX are present. Therefore, in the case of the first embodiment, since the plug P1s (see FIG. 14) is connected to the semiconductor layer SM in the circuit region 1A and the plug P2s (see FIG. 14 and FIG. 20) is connected to the semiconductor layer SM in the TEG region 1B, the plug P1s in the circuit region 1A and the plug P2s in the TEG region 1B are both connected to the semiconductor layer SM (SM1) of the SOI substrate 1. Namely, the plug P2s to be the target of the VC inspection has the configuration similar to that of the plug P1s composing the circuit in the circuit region 1A. Therefore, by inspecting the TEG formed in the TEG region 1B and confirming by the VC inspection whether or not the plug P2s in the TEG region 1B is normally formed, it is possible to accurately estimate whether the plug P1s in the circuit region 1A is normally formed, and the reliability of the estimation can be increased. Consequently, the reliability of the VC inspection can be further improved. Therefore, the reliability of the semiconductor device including the TEG used for the VC inspection can be improved, and the reliability of the semiconductor device manufactured thereafter can be improved.

Forming Position of Plug P2a

Figure 22:
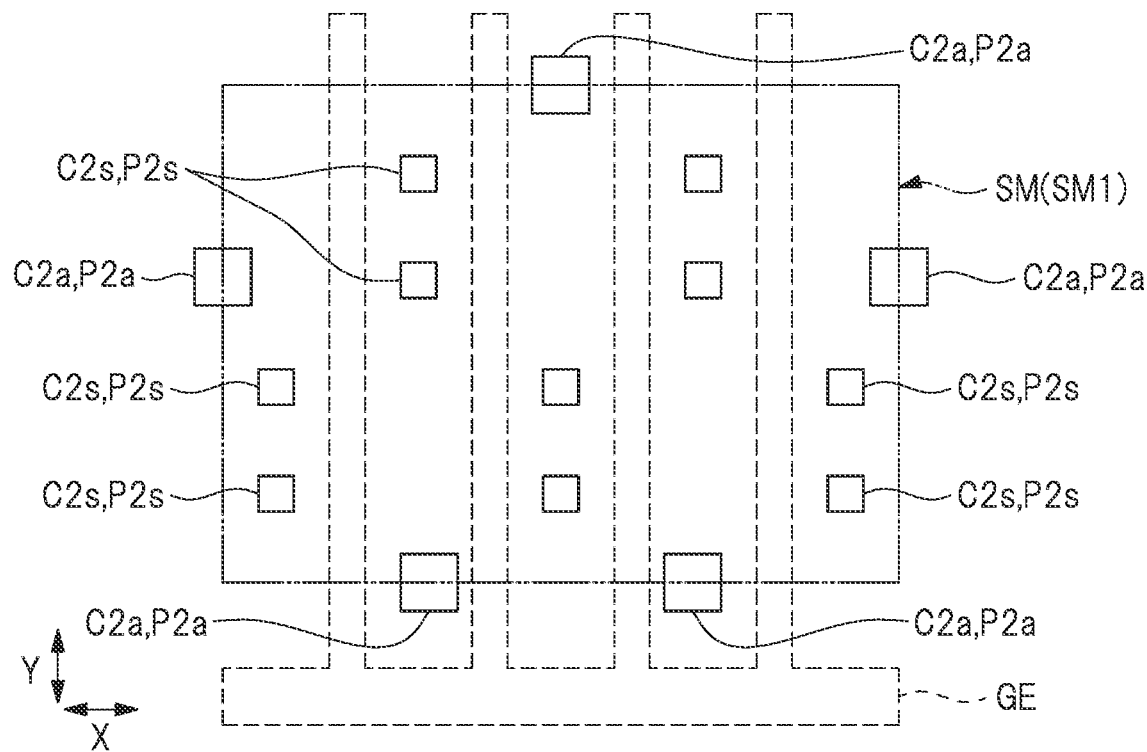
FIG. 22 is a plan view showing an example of a planar layout of a TEG.

Next, the forming position of the p2a for electrically connecting the semiconductor substrate SB and the semiconductor layer SM in the TEG region 1B will be described. FIG. 22 is a plan view showing an example of a planar layout of the TEG formed in the TEG region 1B. In FIG. 22, the X direction and the Y direction are orthogonal to each other. Note that, since the plug P2a is buried in the contact hole C2a, the forming position of the plug P2a is substantially the same as the forming position of the contact hole C2a.

Figure 23:
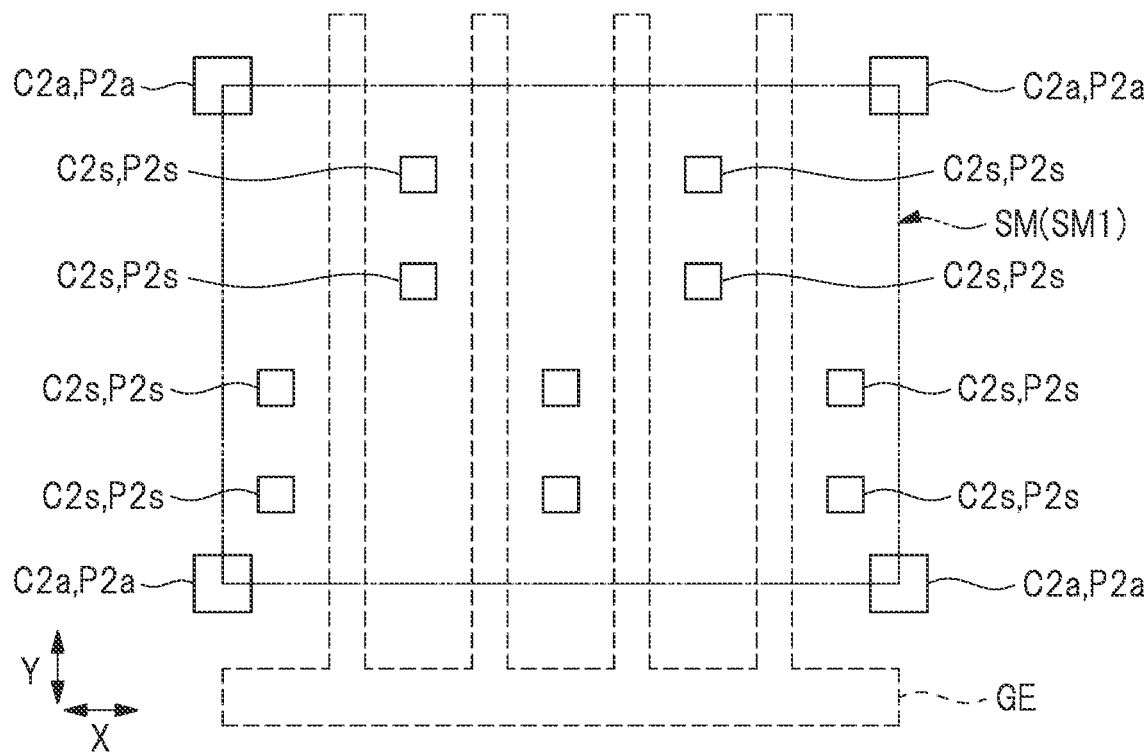
FIG. 23 is a plan view showing another example of a planar layout of a TEG.

As shown in FIG. 22 and FIG. 23 described later, in the TEG region 1B, the contact hole C2a and the plug P2a buried in the contact hole C2a are formed at the position overlapping the boundary between the semiconductor layer SM (SM1) and the element isolation region ST surrounding the semiconductor layer SM (SM1) in a plan view. Accordingly, since both the semiconductor layer SM (SM1) and the semiconductor substrate SB are exposed from the contact hole C2a (see FIG. 13 and FIG. 14), the plug P2a buried in the contact hole C2a, electrically connected to both the semiconductor layer SM (SM1) and the semiconductor substrate SB, so that the semiconductor layer SM (SM1) and the semiconductor substrate SB are electrically connected (short-circuited) to each other via the plug P2a.

In the case of FIG. 22, the planar shape of the semiconductor layer SM (SM1) surrounded by the element isolation region ST in a plan view is a rectangle having two sides parallel to the X direction and two sides parallel to the Y direction, and contact holes C2a (plugs P2a) are arranged on each of the four sides (in the middle of the four sides) of the rectangle. Each side of the rectangle crosses the contact hole C2a (plug P2a) in a plan view. By arranging the contact holes C2a (plugs P2a) on each side of the semiconductor layer SM (SM1) surrounded by the element isolation region ST in a plan view, the semiconductor layer SM (SM1) and the semiconductor substrate SB can be connected with low resistance via the plugs P2a. Consequently, it becomes easy to ensure the amount of current that flows from the semiconductor substrate SB to the plug PG (P2s1) normally connected to the semiconductor layer SM (SM1) via the plug P2a and the semiconductor layer SM (SM1) when irradiated with electron beam in the VC inspection. This makes it easier to ensure the light emission amount (light emission intensity) of the plug PG (P2s1) normally connected to the semiconductor layer SM (SM1) in the VC inspection.

FIG. 23 is a plan view showing another example of a planar layout of the TEG formed in the TEG region 1B.

In the case of FIG. 23, the planar shape of the semiconductor layer SM (SM1) surrounded by the element isolation region ST in a plan view is a rectangle having two sides parallel to the X direction and two sides parallel to the Y direction, and contact holes C2a (plugs P2a) are arranged at the four corners of the rectangle. By arranging the contact holes C2a (plugs P2a) at the four corners of the semiconductor layer SM (SM1) surrounded by the element isolation region ST in a plan view, the semiconductor layer SM (SM1) and the semiconductor substrate SB can be connected with low resistance via the plugs P2a. Consequently, it becomes easy to ensure the amount of current that flows from the semiconductor substrate SB to the plug PG (P2s1) normally connected to the semiconductor layer SM (SM1) via the plug P2a and the semiconductor layer SM (SM1) when irradiated with electron beam in the VC inspection. This makes it easier to ensure the light emission amount (light emission intensity) of the plug PG (P2s1) normally connected to the semiconductor layer SM (SM1) in the VC inspection.

Also, the forming position of the contact hole CT is dislocated from the designed position in some cases due to the misalignment of the photomask or the like in the photolithography process for forming the contact hole CT. In that case, in FIG. 23, a total of four contact holes C2a arranged at the four corners of the semiconductor layer SM are dislocated in the same direction. Therefore, in the case of FIG. 23, even when the forming position of the contact hole C2a is dislocated from the designed position, it is possible to prevent all of the four contact holes C2a arranged at the four corners of the semiconductor layer SM from being located at positions that do not overlap the semiconductor layer SM in a plan view, so that at least one of the four contact holes C2a can connect the semiconductor layer SM and the semiconductor substrate SB. Therefore, in the case of FIG. 23, the allowance (margin) to the mislocation of the contact hole C2a is increased, and the step of forming the contact hole CT can be performed more easily.

Further, it has been described that the planar size (plane area) of the contact hole C2a is the same as the planar size (plane area) of the contact hole C2s, but it is more preferable that the planar size (plane area) of the contact hole C2a is larger than the planar size (plane area) of the contact hole C2s. Namely, it is more preferable that the planar size (plane area) of the plug P2a is larger than the planar size (plane area) of the P2s. In other words, it is more preferable that the diameter of the contact hole C2a (plug P2a) is larger than the diameter of the contact hole C2s (plug P2s).

By increasing the planar size (plane area) of the contact hole C2a, the allowance (margin) to the mislocation of the contact hole C2a is increased. Also, by increasing the planar size (plane area) of the contact hole C2a, the etching for forming the contact hole C2a can be performed more easily, so that the semiconductor layer SM and the semiconductor substrate SB can be more reliably exposed from the contact hole C2a. Further, since the contact hole C2a needs to reach the semiconductor substrate SB, the depth of the contact hole C2a is deeper than the depth of the contact hole C2s. The etching of the contact hole becomes more difficult as the depth of the contact hole increases, and the etching of the contact hole becomes easier as the planar size (plane area) of the contact hole increases. Therefore, by increasing the planar size (plane area) of the contact hole C2a which is deeper than the contact hole C2s, the contact hole C2a reaching the semiconductor substrate SB can be formed more accurately.

As an example, when the gate electrode GE has the gate length of about 55 nm, the diameter of the contact hole C2s can be, for example, about 0.08 µm, and the diameter of the contact hole C2a can be, for example, about 0.16 µm which is about twice as large as the diameter of the contact hole C2s.

Further, in the first embodiment, the TEG to be the target of the VC inspection is formed in the scribe region SR, and in this case, the TEG region 1B is included in the scribe region SR. As another embodiment, the TEG to be the target of the VC inspection can be formed in the chip region CR instead of the scribe region SR, and in this case, the TEG region 1B is included in the chip region CR. However, since the TEG to be the target of the VC inspection is not the circuit used as a product, it is preferable to form the TEG in the scribe region SR. By forming the TEG to be the target of the VC inspection in the scribe region, the manufactured semiconductor chip does not include the TEG to be the target of the VC inspection, and it is thus possible to reduce the area of the semiconductor chip. Further, it is possible to increase the number of semiconductor chips acquired from one SOI substrate 1.

Second Embodiment

Figure 24:
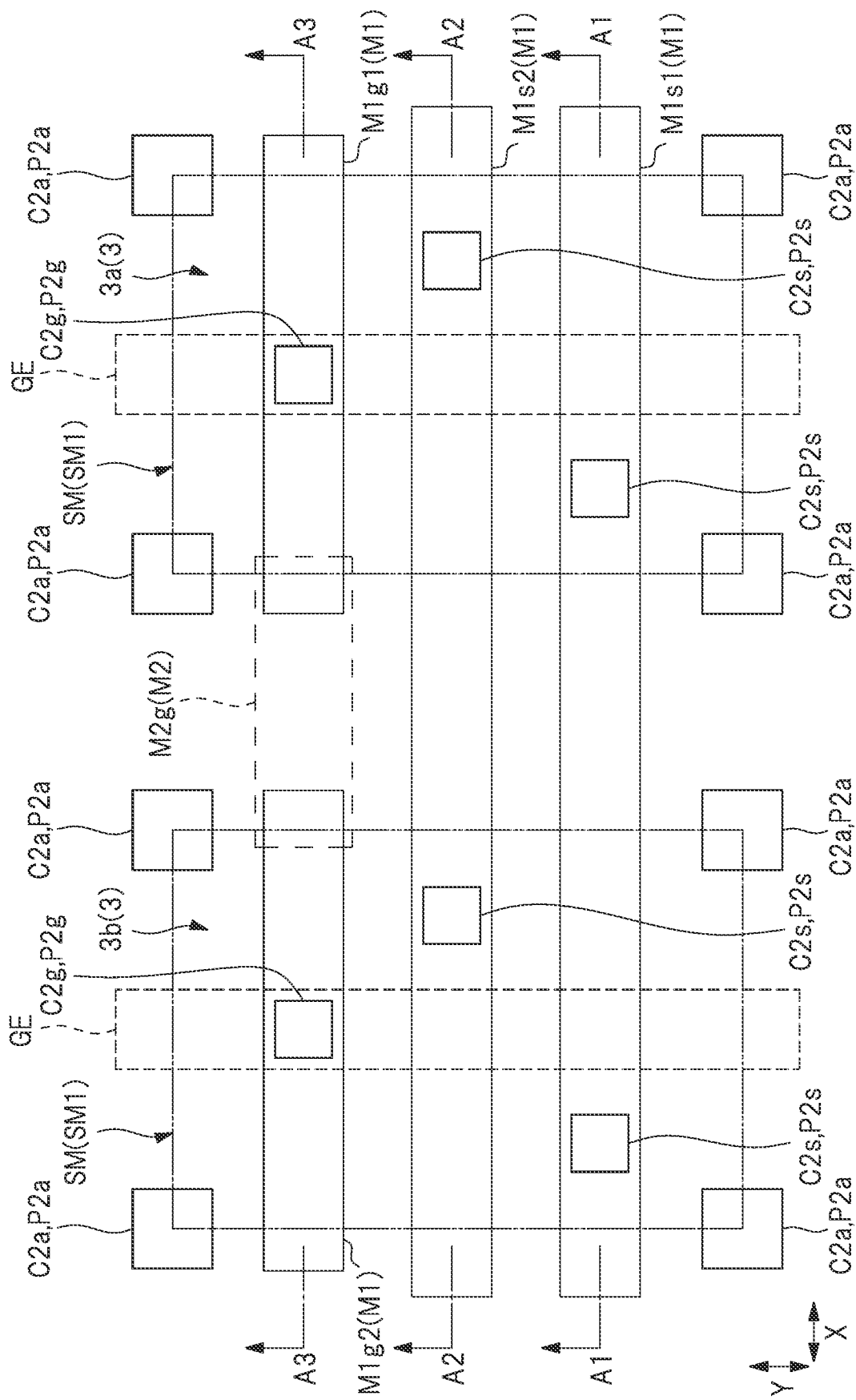
FIG. 24 is a plan view showing a principal part in the process for manufacturing the semiconductor device according to another embodiment (second embodiment).
Figure 25:
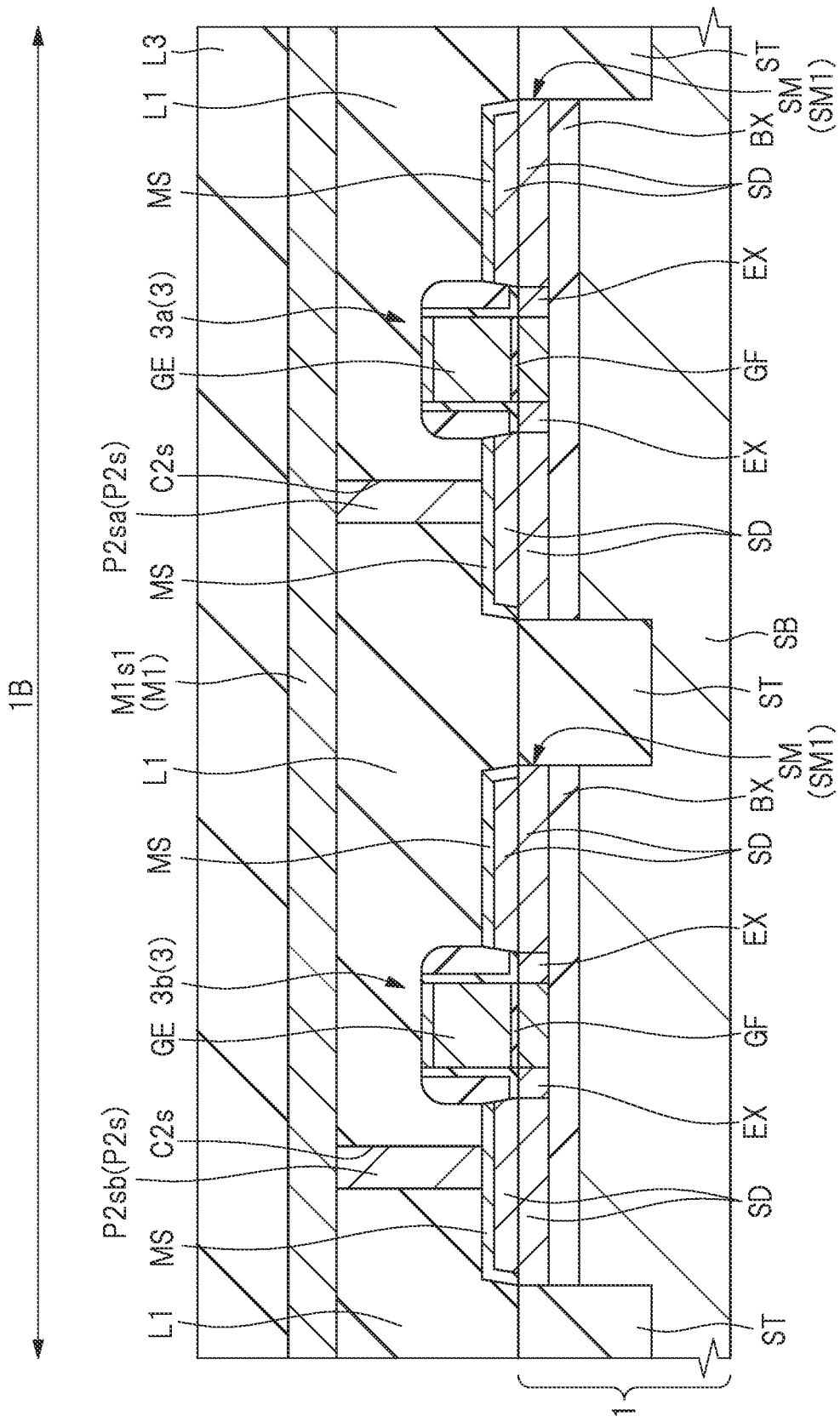
FIG. 25 is a cross-sectional view showing a principal part in the process for manufacturing the semiconductor device according to the embodiment (second embodiment).
Figure 26:
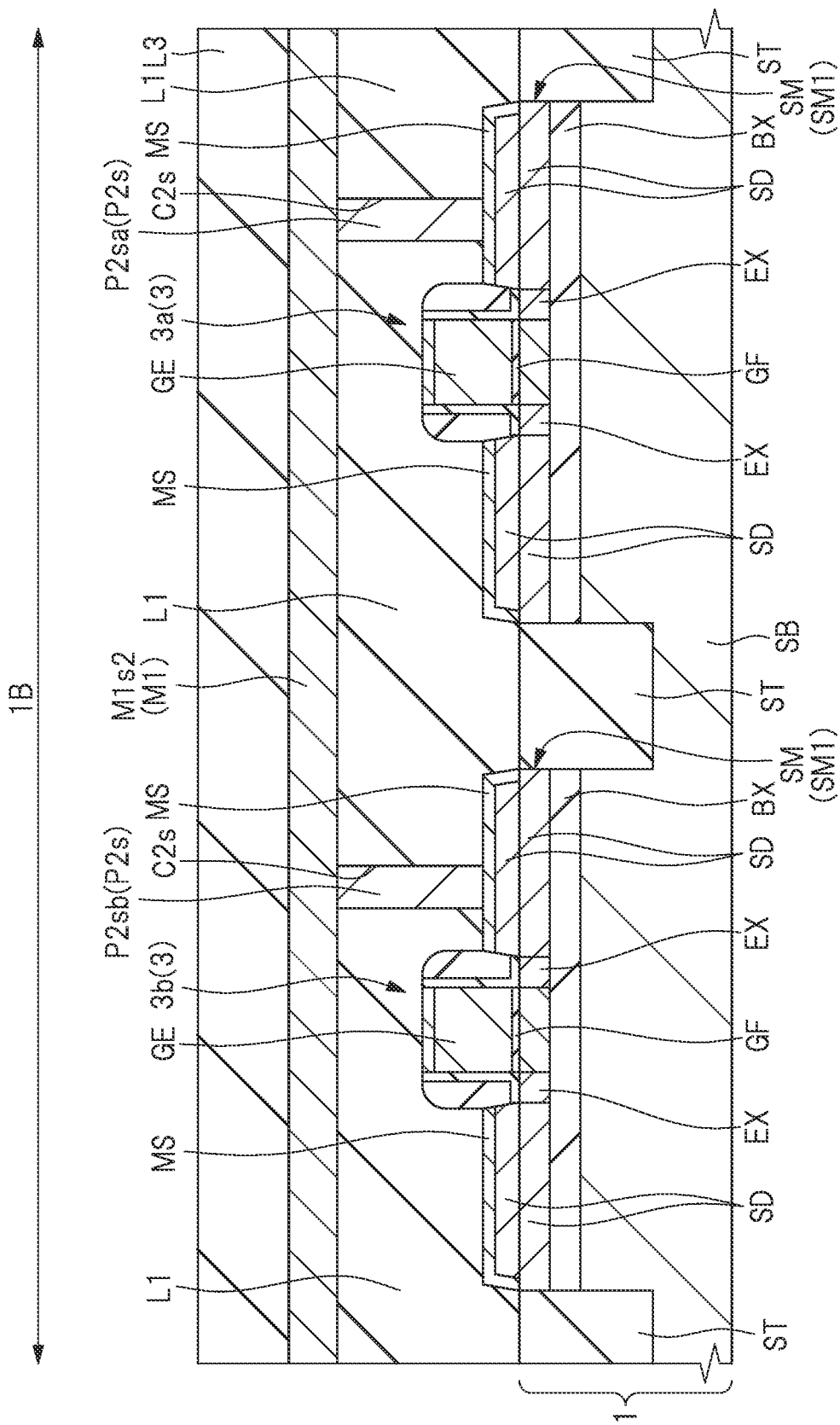
FIG. 26 is a cross-sectional view showing a principal part in the process for manufacturing the semiconductor device according to the embodiment (second embodiment).
Figure 27:
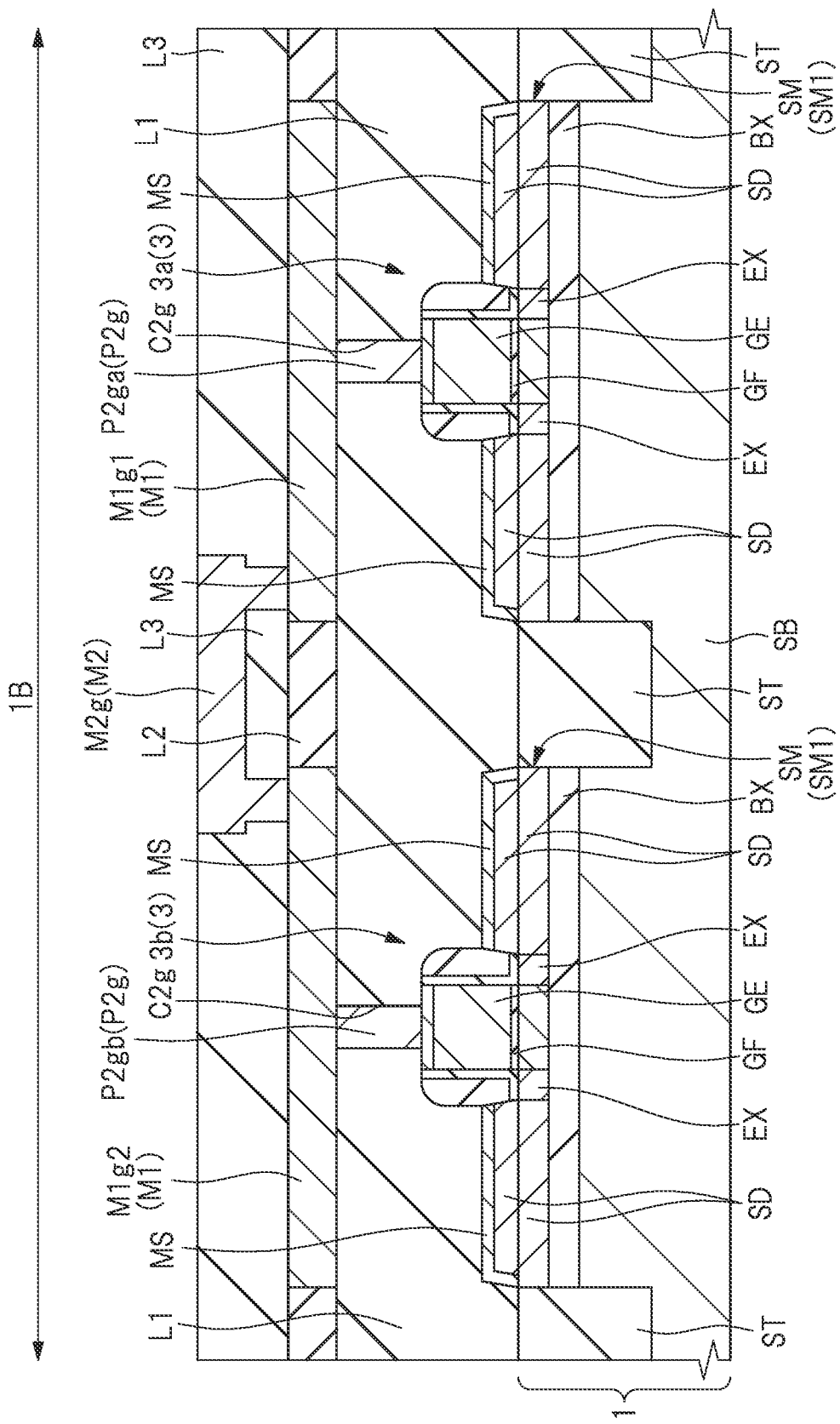
FIG. 27 is a cross-sectional view showing a principal part in the process for manufacturing the semiconductor device according to the embodiment (second embodiment).

FIG. 24 is a plan view showing a principal part in the process for manufacturing the semiconductor device according to the second embodiment, and FIG. 25 to FIG. 27 are cross-sectional views each showing a principal part in the process for manufacturing the semiconductor device according to the second embodiment. FIG. 24 to FIG. 27 show part of the TEG region 1B. The cross-sectional view at the position of the line A1-A1 in FIG. 24 substantially corresponds to FIG. 25, the cross-sectional view at the position of the line A2-A2 in FIG. 24 substantially corresponds to FIG. 26, and the cross-sectional view at the position of the line A3-A3 in FIG. 24 substantially corresponds to FIG. 27. Although FIG. 24 to FIG. 27 show the case where each one MISFET is formed on the semiconductor layer SM (SM1) surrounded by the element isolation region in a plan view, the number of MISFETs formed on the semiconductor layer SM (SM1) surrounded by the element isolation region may be two or more.

As shown in FIG. 24 to FIG. 27, in the TEG region 1B, MISFETs 3a and 3b are formed as MISFETs 3 composing the TEG.

The plug P2g buried in the contact hole C2g is connected to each of the gate electrode GE of the MISFET 3a and the gate electrode GE of the MISFET 3b. The plug P2s buried in the contact hole C2s is connected to each of the n$^+$ type semiconductor region SD of the MISFET 3a and the n$^+$ type semiconductor region SD of the MISFET 3b. Here, the plug P2g connected to the gate electrode GE of the MISFET 3a is referred to as a plug (gate plug) P2ga, and the plug P2g connected to the gate electrode GE of the MISFET 3b is referred to as a plug (gate plug) P2gb. Further, the plug P2s connected to the n$^+$ type semiconductor region SD of the MISFET 3a is referred to as a plug P2sa, and the plug P2s connected to the n$^+$ type semiconductor region SD of the MISFET 3b is referred to as a plug P2sb.

The plug P2a is formed also to the semiconductor layer SM (SM1) on which the MISFET 3a is formed, and the semiconductor layer SM (SM1) on which the MISFET 3a is formed is electrically connected to the semiconductor substrate SB via the plug P2a. Further, the plug P2a is formed also to the semiconductor layer SM (SM1) on which the MISFET 3b is formed, and the semiconductor layer SM (SM1) on which the MISFET 3b is formed is electrically connected to the semiconductor substrate SB via the plug P2a.

A wiring M1ga is connected as the wiring M1 to the plug P2ga and a wiring M1gb is connected as the wiring M1 to the plug P2gb, but the wiring M1ga and the wiring M1gb are not integrally formed and are separated from each other. The wiring M1ga and the wiring M1gb are connected to a common wiring M2g included in the second-layer wiring M2.

The wiring M1ga and the wiring M1gb included in the first-layer wiring M1 are separated from each other, but since the wiring M1ga and the wiring M1gb are connected to the common wiring M2g, the wiring M1ga and the wiring M1gb are electrically connected via the wiring M2g. Therefore, the gate electrode GE of the MISFET 3a is electrically connected to the wiring M2g via the plug P2ga and the wiring M1ga, and the gate electrode GE of the MISFET 3b is electrically connected to the wiring M2g via the plug P2gb and the wiring M1gb. Accordingly, the wiring M2g is electrically connected to both the gate electrode GE of the MISFET 3a and the gate electrode GE of the MISFET 3b.

The plug P2sa connected to one n$^+$ type semiconductor region SD (source) of the MISFET 3a and the plug P2sb connected to one n$^+$ type semiconductor region SD (source) of the MISFET 3b are connected to the common wiring M1s1 included in the first-layer wiring M1. Further the plug P2sa connected to the other n$^+$ type semiconductor region SD (drain) of the MISFET 3a and the plug P2sb connected to the other n$^+$ type semiconductor region SD (drain) of the MISFET 3b are connected to the common wiring M1s2 included in the first-layer wiring M1.

Figure 28:
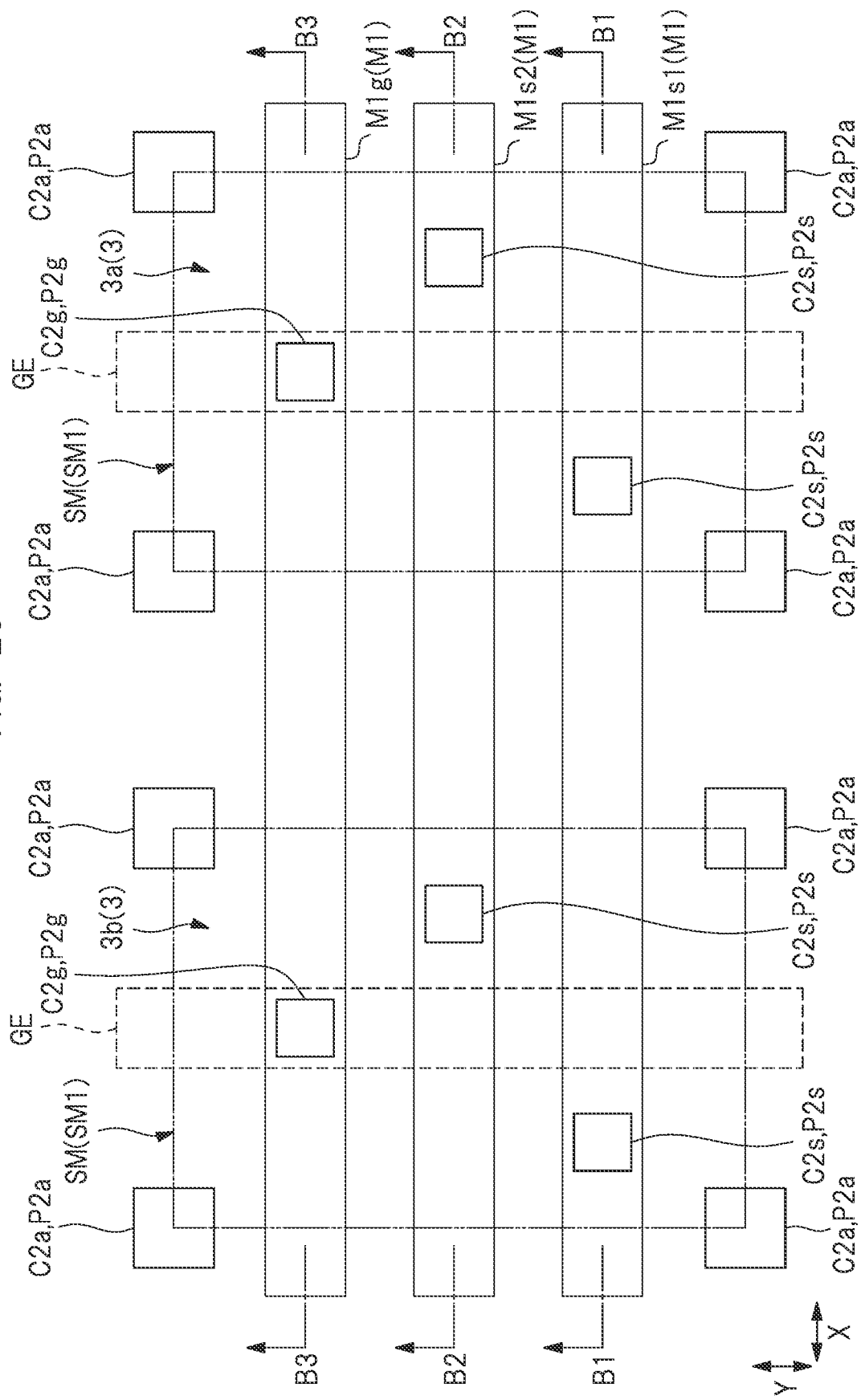
FIG. 28 is a plan view showing a principal part in the process for manufacturing the semiconductor device according to the fourth studied example.
Figure 29:
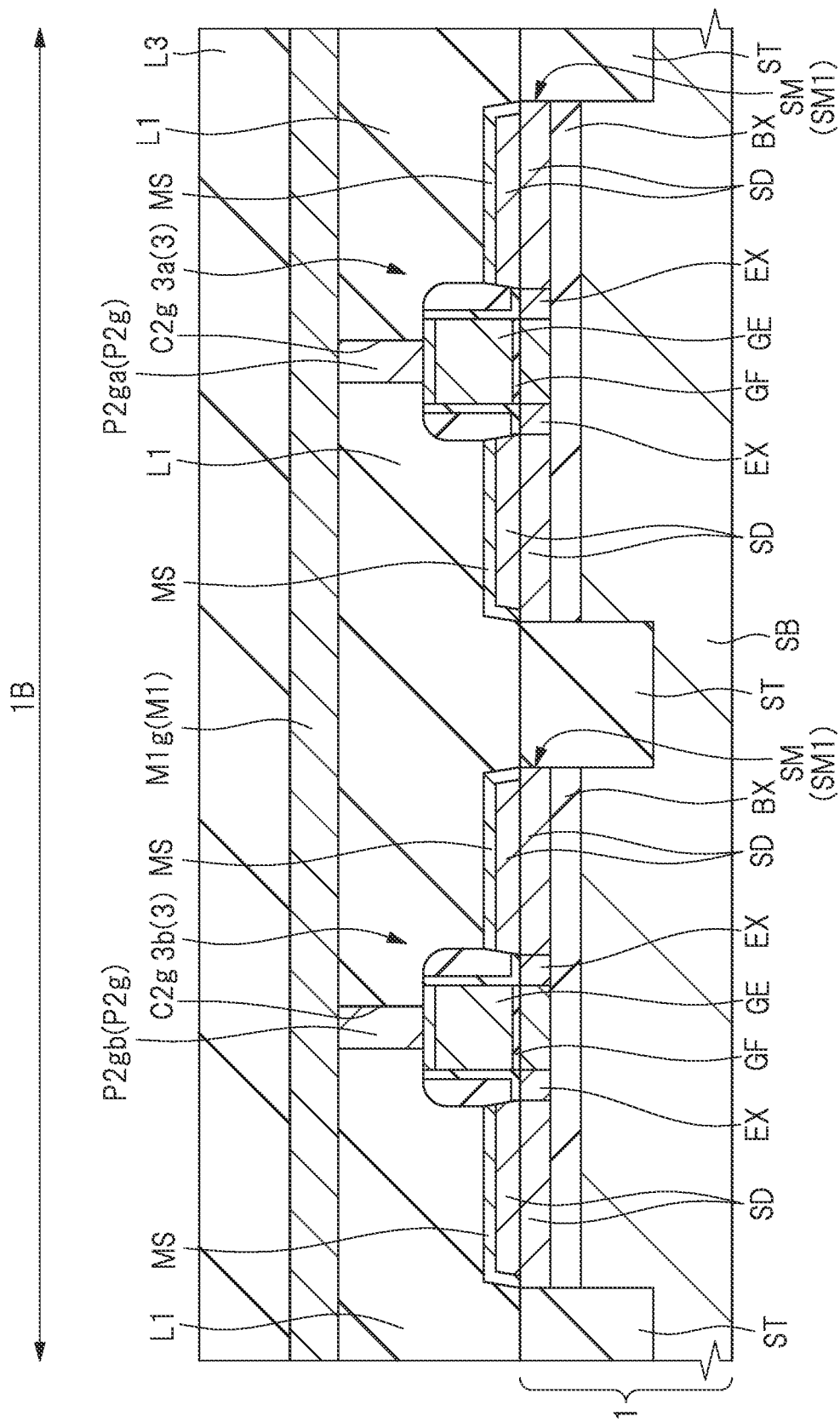
FIG. 29 is a cross-sectional view showing a principal part in the process for manufacturing the semiconductor device according to the fourth studied example.

FIG. 28 and FIG. 29 are a plan view (FIG. 28) and a cross-sectional view (FIG. 29) showing the principal part in the process for manufacturing the semiconductor device according to the fourth studied example studied by the inventors, and each corresponds FIG. 24 and FIG. 27, respectively. The cross-sectional view at the position of the line B3-B3 in FIG. 28 substantially corresponds to FIG. 29. Since the cross-sectional view at the position of the line B1-B1 in FIG. 28 is almost the same as FIG. 25 and the cross-sectional view at the position of the line B2-B2 in FIG. 28 is almost the same as FIG. 26, the repetitive descriptions thereof are omitted here.

The fourth studied example shown in FIG. 28 and FIG. 29 is different from the second embodiment shown in FIG. 24 to FIG. 27 in the following points.

That is, in the case of the fourth studied example shown in FIG. 28 and FIG. 29, the plug P2ga and the plug P2gb are electrically connected to the common wiring M1g included in the wiring M1. Therefore, in the case of the fourth studied example shown in FIG. 28 and FIG. 29, the wirings M1ga, M1gb, and M2g are not formed. In the case of the fourth studied example shown in FIG. 28 and FIG. 29, the gate electrode GE of the MISFET 3a is electrically connected to the wiring M1g via the plug P2ga and the gate electrode GE of the MISFET 3b is electrically connected to the wiring M1g via the plug P2gb, and thus the wiring M1g is electrically connected to both the gate electrode GE of the MISFET 3a and the gate electrode GE of the MISFET 3b.

Here, in the fourth studied example shown in FIG. 28 and FIG. 29, the case where the VC inspection is performed to confirm whether or not the gate electrodes GE of the MISFETs 3a and 3b are short circuited with the semiconductor layer SM will be considered. In this case, the VC inspection can be performed in the state where the insulating films L3, L4, L5, and L6 and the wirings M2, M3, and M4 are removed by polishing or the like and the wiring M1 (M1gg, M1s1, M1s2) remains, for example, in the state where the upper surface of the wiring M1 (M1g, M1s1, M1s2) is exposed.

When irradiated with electron beam in the VC inspection, the wiring M1g does not emit light if neither the gate electrode GE of the MISFET 3a nor the gate electrode GE of the MISFET 3b is short-circuited with the semiconductor layer SM, while the wiring M1g emits light if at least one of the gate electrode GE of the MISFET 3a and the gate electrode GE of the MISFET 3b is short-circuited with the semiconductor layer SM. Therefore, it is possible to determine whether neither the gate electrode GE of the MISFET 3a nor the gate electrode GE of the MISFET 3b is short-circuited with the semiconductor layer SM or at least one of the gate electrode GE of the MISFET 3a and the gate electrode GE of the MISFET 3b is short-circuited with the semiconductor layer SM, by confirming the presence/absence of the light emission of the wiring M1g. However, when the wiring M1g emits light, it is possible to determine whether at least one of the gate electrode GE of the MISFET 3a and the gate electrode GE of the MISFET 3b is short-circuited with the semiconductor layer SM, but it is not possible to determine which of the gate electrode GE of the MISFET 3a and the gate electrode GE of the MISFET 3b is short-circuited with the semiconductor layer SM. Therefore, it is difficult to identify the location where the short-circuit between the gate electrode GE and the semiconductor layer SM occurs due to the formation failure of the gate insulating film GF or the like. Namely, it is difficult to determine in which of the plurality of MISFETs 3 (3a, 3b) for the TEG formed in the TEG region 1B the short-circuit between the gate electrode GE and the semiconductor layer SM occurs.

Next, in the second embodiment shown in FIG. 24 to FIG. 27, the case where the VC inspection is performed to confirm whether or not the gate electrodes GE of the MISFETs 3a and 3b are short-circuited with the semiconductor layer SM will be considered. Also in this case, the VC inspection can be performed in the state where the insulating films L3, L4, L5, and L6 and the wirings M2, M3, and M4 are removed by polishing or the like and the wiring M1 (M1ga, M1gb, M1s1, M1s2) remains, for example, in the state where the upper surface of the wiring M1 (M1ga, M1gb, M1s1, M1s2) is exposed. In this state, the wiring M1ga and the wiring M1gb are separated from each other and are not electrically connected to each other. Namely, the wiring M1ga and the wiring M1gb are electrically connected via the wiring M2g in the state where the wiring M2g is present, but if the wiring M2g is removed, the wiring M1ga and the wiring M1gb are no longer electrically connected to each other, and the VC inspection is performed in this state.

When irradiated with electron beam in the VC inspection, the wiring M1ga does not emit light if the gate electrode GE of the MISFET 3a is not short-circuited with the semiconductor layer SM, while the wiring M1ga emits light if the gate electrode GE of the MISFET 3a is short-circuited with the semiconductor layer SM. Further, when irradiated with electron beam in the VC inspection, the wiring M1gb does not emit light if the gate electrode GE of the MISFET 3b is not short-circuited with the semiconductor layer SM, while the wiring M1gb emits light if the gate electrode GE of the MISFET 3b is short-circuited with the semiconductor layer SM. Therefore, it is possible to determine whether or not the gate electrode GE of the MISFET 3a is short-circuited with the semiconductor layer SM by confirming the presence/absence of the light emission of the wiring M1ga, and it is possible to determine whether or not the gate electrode GE of the MISFET 3b is short-circuited with the semiconductor layer SM by confirming the presence/absence of the light emission of the wiring M1gb. For example, the gate electrode GE of the MISFET 3a is insulated from the semiconductor layer SM via the gate insulating film GF, but if the gate electrode GE of the MISFET 3b is short-circuited with the semiconductor layer SM due to the formation failure of the gate insulating film GF or the like, the wiring M1ga does not emit light and the wiring M1gb emits light. Further, for example, the gate electrode GE of the MISFET 3b is insulated from the semiconductor layer SM via the gate insulating film GF, but if the gate electrode GE of the MISFET 3a is short-circuited with the semiconductor layer SM due to the formation failure of the gate insulating film GF or the like, the wiring M1gb does not emit light, and the wiring M1ga emits light. Accordingly, it is possible to confirm the presence/absence of the short-circuit between the gate electrode GE and the semiconductor layer SM for each of the MISFETs 3a and 3b. Therefore, it is possible to identify the location where the short-circuit between the gate electrode GE and the semiconductor layer SM occurs due to the formation failure of the gate insulating film GF or the like. Namely, it is possible to determine in which of the plurality of MISFETs 3 (3a, 3b) for the TEG formed in the TEG region 1B the short-circuit between the gate electrode GE and the semiconductor layer SM occurs.

Further, in the case of the second embodiment shown in FIG. 24 to FIG. 27, it s possible to confirm whether each of the wirings M1ga and M1gb is not short-circuited with the wiring M1s1 or the wiring M1s2 by confirming the presence/absence of the light emission of the wirings M1ga and M1gb in the VC inspection.

Also, in the case of the second embodiment shown in FIG. 24 to FIG. 27, the VC inspection can be performed in the state where the wiring M2 is removed by polishing or the like and the upper surface of the wiring M1 (M1ga, M1gb, M1s1, M1s2) is exposed as described above, but as another embodiment, it is also possible to perform the VC inspection in the state where the wiring portion of the wiring M2 is removed but the via portion of the wiring M2 remains. Note that the via portion of the wiring M2 is a portion that connects the wiring portion of the wiring M2 and the wiring M1, and is a conductor portion (connecting portion, plug portion) buried in the via hole between the wiring portion of the wiring M2 and the wiring M1. In this case, the via portion of the wiring M2g remains on each of the wirings M1ga and M1gb, but since the wiring portion of the wiring M2g has been removed, the VC inspection is performed in the state where the wiring M1ga and the wiring M1gb are not electrically connected to each other. In the VC inspection, it is possible to determine that the gate electrode GE of the MISFET 3a is short-circuited with the semiconductor layer SM if the via portion of the wiring M2g remaining on the wiring M1ga emits light, and it is possible to determine that the gate electrode GE of the MISFET 3a is not short-circuited with the semiconductor layer SM if the via portion of the wiring M2g remaining on the wiring M1ga does not emit light. Also, in the VC inspection, it is possible to determine that the gate electrode GE of the MISFET 3b is short-circuited with the semiconductor layer SM if the via portion of the wiring M2g remaining on the wiring M1gb emits light, and it is possible to determine that the gate electrode GE of the MISFET 3b is not short-circuited with the semiconductor layer SM if the via portion of the wiring M2g remaining on the wiring M1gb does not emit light. Therefore, it is possible to identify the location where the short-circuit between the gate electrode GE and the semiconductor layer SM occurs due to the formation failure of the gate insulating film GF or the like.

Figure 30:
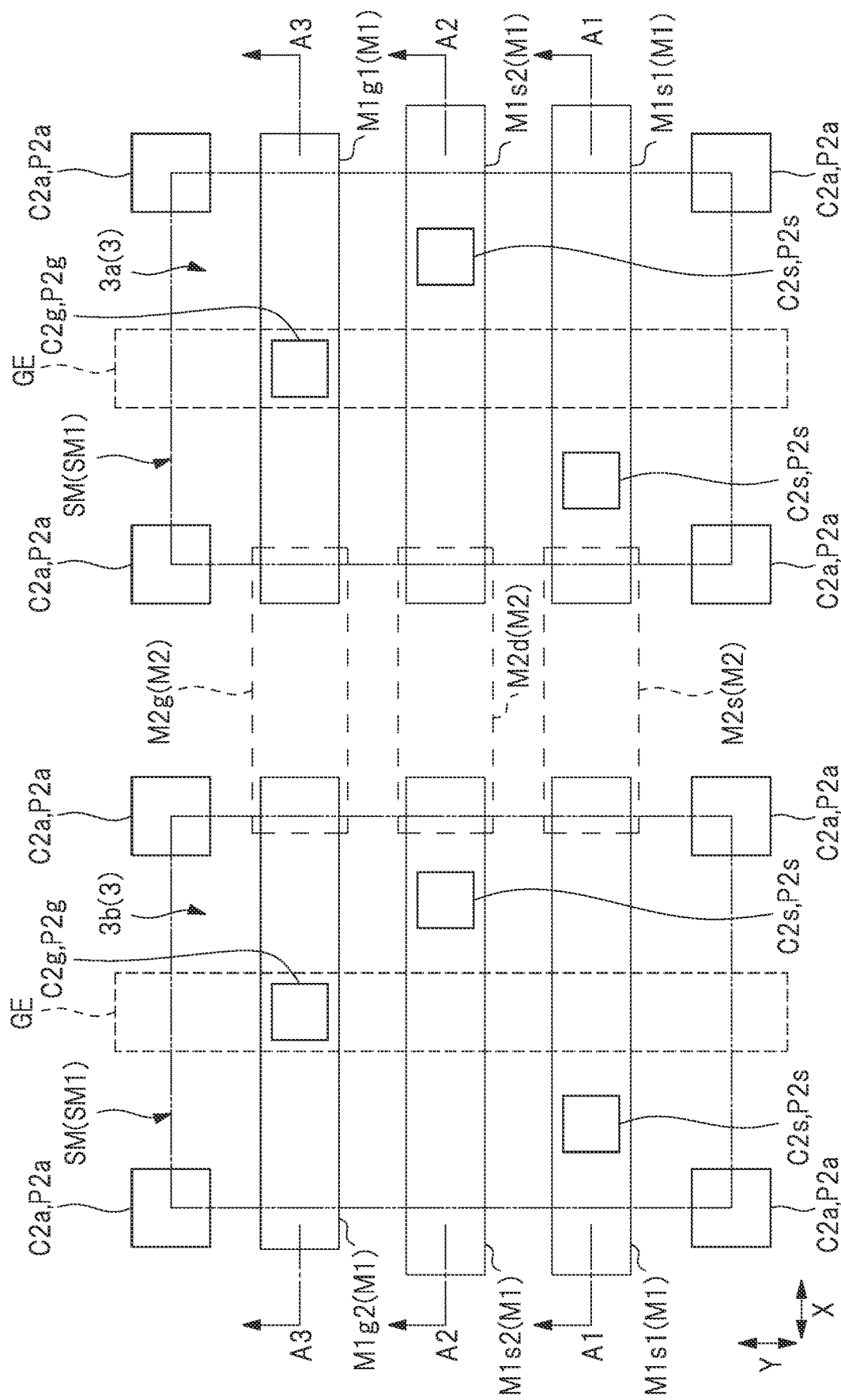
FIG. 30 is a plan view showing a principal part in the process for manufacturing the semiconductor device according to a modification of the embodiment (second embodiment).

Also, in the case of FIG. 24 to FIG. 27, in the TEG region 1B, the wiring M1g1 (gate wiring M1) connected to the plug P2g connected to the gate electrode GE of the MISFET 3a and the wiring M1g2 (gate wiring M1) connected to the plug P2g connected to the gate electrode GE of the MISFET 3b are separated, and the separated wirings M1g1 and M1g2 are connected by the wiring M2g (gate wiring M2) in the upper layer. This can be applied to the source wiring and the drain wiring, and FIG. 30 shows that case. FIG. 30 is a plan view showing a modification of the second embodiment, and corresponds to FIG. 24 described above.

Namely, as shown in FIG. 30, in the TEG region 1B, the wiring M1s1 (source wiring M1) connected to the plug P2s connected to the source region ($n^+$ type semiconductor region SD) of the MISFET 3a and the wiring M1s1 (source wiring M1) connected to the plug P2s connected to the source region ($n^+$ type semiconductor region SD) of the MISFET 3b are separated, and the separated wirings M1s1 (source wirings M1) can be connected by the wiring M2s (source wiring M2) in the upper layer. Also in this case, as in the second embodiment, the VC inspection can be performed in the state where the insulating films L3, L4, L5, and L6 and the wirings M2, M3, and M4 are removed by polishing or the like and the wiring M1 remains. Consequently, in the TEG region 1B, it is possible to determine whether or not the source region ($n^+$ type semiconductor region SD) of the MISFET 3a and the plug P2s are accurately connected and whether or not the source region ($n^+$ type semiconductor region SD) of the MISFET 3b and the plug P2s are accurately connected, and it is possible to identify the location where the formation failure of the plug P2s occurs. In this case, as described in the first embodiment, if the plug P2s or the wiring M1s1 connected to the plug P2s does not emit light, it is possible to determine that the formation failure occurs in the plug P2s.

Also, as shown in FIG. 30, in the TEG region 1B, the wiring M1s2 (drain wiring M1) connected to the plug P2s connected to the drain region ($n^+$ type semiconductor region SD) of the MISFET 3a and the wiring M1s2 (drain wiring M1) connected to the plug P2s connected to the drain region ($n^+$ type semiconductor region SD) of the MISFET 3b are separated, and the separated wirings M1s2 (drain wirings M1) can be connected by the wiring M2d (drain wiring M2) in the upper layer. Also in this case, as in the second embodiment, the VC inspection can be performed in the state where the insulating films L3, L4, L5, and L6 and the wirings M2, M3, and M4 are removed by polishing or the like and the wiring M1 remains. Consequently, in the TEG region 1B, it is possible to determine whether or not the drain region ($n^+$ type semiconductor region SD) of the MISFET 3a and the plug P2s are accurately connected and whether or not the drain region ($n^+$ type semiconductor region SD) of the MISFET 3b and the plug P2s are accurately connected, and it is possible to identify the location where the formation failure of the plug P2s occurs. In this case, as described in the first embodiment, if the plug P2s or the wiring M1s2 connected to the plug P2s does not emit light, it is possible to determine that the formation failure occurs in the plug P2s.

In the foregoing, the invention made by the inventors has been specifically described based the embodiments, but it is needless to say that the present invention is not limited to the embodiments described above and can be variously modified within the range not departing from the gist thereof.

What is claimed is:

1. A method of manufacturing a semiconductor device, the method comprising steps of:
   (a) providing an SOI (Silicon On Insulator) substrate having a main surface including a first region and a second region, and having a stacked structure including a semiconductor substrate, an insulating layer on the semiconductor substrate, and a semiconductor layer on the insulating layer, the main surface being located on the semiconductor layer;
   (a1) after the step of (a), forming an element isolation region buried in a trench that penetrates through the semiconductor layer and the insulating layer and reaches the semiconductor substrate;
   (b) after the step of (a1), forming a first MISFET composing a certain circuit on the semiconductor layer in the first region, and forming a second MISFET composing a TEG (Test Elemental Group) for VC (Voltage Contrast) inspection on the semiconductor layer in the second region;
   (c) forming a first interlayer insulating film on the main surface of the SOI substrate so as to cover the first MISFET and the second MISFET;
   (d) forming a plurality of first contact holes in the first interlayer insulating film located in the first region, and forming a plurality of second contact holes in the first interlayer insulating film located in the second region; and
   (e) forming a plurality of first contact plugs in the plurality of first contact holes, respectively, and forming a plurality of second contact plugs in the plurality of second contact holes, respectively,
   wherein the plurality of second contact plugs includes a third contact plug electrically connected to both the semiconductor layer located in the second region and the semiconductor substrate located in the second region,
   wherein the third contact plug reaches the semiconductor substrate, and
   wherein the third contact plug is formed at a boundary between the semiconductor layer and the element isolation region surrounding the semiconductor layer in a plan view.

2. The method of manufacturing the semiconductor device according to claim 1, further comprising a step of:
   (f) after the (e), performing the VC inspection.

3. The method of manufacturing the semiconductor device according to claim 1,
   wherein the plurality of second contact plugs includes a fourth contact plug formed on the semiconductor layer in the second region and electrically connected to the semiconductor layer in the second region, and
   wherein the fourth contact plug does not reach the semiconductor substrate.

4. The method of manufacturing the semiconductor device according to claim 3,
   wherein, of the plurality of second contact holes, a planar size of the third contact plug is larger than a planar size of the fourth contact plug.

5. The method of manufacturing the semiconductor device according to claim 1,
   wherein the plurality of second contact holes includes a third contact hole which exposes the semiconductor layer in the second region and the semiconductor substrate in the second region, and the third contact plug is buried in the third contact hole.

6. The method of manufacturing the semiconductor device according to claim 1,
   wherein the third contact plug is formed at each of four corners of the semiconductor layer surrounded by the element isolation region in a plan view.

7. The method of manufacturing the semiconductor device according to claim 1,
   wherein the third contact plug is formed on each of four sides of the semiconductor layer surrounded by the element isolation region in a plan view.

8. The method of manufacturing the semiconductor device according to claim 1,
   wherein the plurality of first contact plugs includes a fifth contact plug electrically connected to the semiconductor layer in the first region and not including a contact plug electrically connected to both the semiconductor layer in the first region and the semiconductor substrate in the first region.

9. The method of manufacturing the semiconductor device according to claim 1,
   wherein the second region is included in a scribe region of the SOI substrate.

10. The method of manufacturing the semiconductor device according to claim 1,
    wherein the first region is included in a chip region of the SOI substrate.

11. The method of manufacturing the semiconductor device according to claim 1, further comprising, after the (e), steps of:
    (e1) forming a first wiring layer on the interlayer insulating film; and
    (e2) forming a second wiring layer on the first wiring layer, wherein, in the (b), a third MISFET as a dummy MISFET composing the TEG is formed on the semiconductor layer in the second region, wherein the second MISFET includes a first gate electrode, wherein the third MISFET includes a second gate electrode, wherein the plurality of second contact plugs includes:
   a first gate plug electrically connected to the first gate electrode; and
   a second gate plug electrically connected to the second gate electrode, wherein the first wiring layer includes:
   a first gate wiring electrically connected to the first gate plug; and
   a second gate wiring electrically connected to the second gate plug, wherein the first gate wiring and the second gate wiring are separated from each other, and wherein the first gate wiring and the second gate wiring are electrically connected via a third gate wiring included in the second wiring layer.

12. The method of manufacturing the semiconductor device according to claim 11, further comprising a step of:
(f) after the (e2), performing the VC inspection in a state where the second wiring layer has been removed.

* * * * *